(12) United States Patent
Sato et al.

(10) Patent No.: US 9,607,828 B2
(45) Date of Patent: Mar. 28, 2017

(54) METHOD OF DEPOSITING A SILICON-CONTAINING FILM

(71) Applicant: Tokyo Electron Limited, Tokyo (JP)

(72) Inventors: Jun Sato, Iwate (JP); Shigehiro Miura, Iwate (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/049,345

(22) Filed: Feb. 22, 2016

(65) Prior Publication Data

US 2016/0254136 A1 Sep. 1, 2016

(30) Foreign Application Priority Data

Feb. 26, 2015 (JP) ................ 2015-036142

(51) Int. Cl.
| | |
|---|---|
| H01L 21/469 | (2006.01) |
| H01L 21/02 | (2006.01) |
| C23C 16/24 | (2006.01) |
| H01L 29/66 | (2006.01) |
| C23C 16/02 | (2006.01) |
| C23C 16/455 | (2006.01) |

(52) U.S. Cl.
CPC ...... *H01L 21/0228* (2013.01); *C23C 16/0272* (2013.01); *C23C 16/24* (2013.01); *C23C 16/45534* (2013.01); *C23C 16/45551* (2013.01); *H01L 21/0262* (2013.01); *H01L 21/02123* (2013.01); *H01L 21/02274* (2013.01); *H01L 21/02304* (2013.01); *H01L 29/66181* (2013.01); *H01L 21/02211* (2013.01); *H01L 21/02579* (2013.01); *H01L 21/02592* (2013.01)

(58) Field of Classification Search
CPC .................................. H01L 21/02211
See application file for complete search history.

(56) References Cited

U.S. PATENT DOCUMENTS

| | | | |
|---|---|---|---|
| 2015/0087161 A1* | 3/2015 | Sato | C23C 16/0272 438/787 |
| 2015/0101532 A1* | 4/2015 | Okada | C23C 16/0272 118/704 |

FOREIGN PATENT DOCUMENTS

| | | |
|---|---|---|
| JP | 2010-251654 | 11/2010 |
| JP | 2010-263245 | 11/2010 |
| JP | 2011-254063 | 12/2011 |

* cited by examiner

*Primary Examiner* — Jaehwan Oh
*Assistant Examiner* — Andre' C Stevenson
(74) *Attorney, Agent, or Firm* — IPUSA, PLLC

(57) ABSTRACT

A method of depositing a silicon-containing film using a film deposition apparatus is provided. The apparatus includes a turntable provided in a process chamber. In the method, a seed layer is formed on a surface of the substrate by supplying an aminosilane gas from the first process gas supplying unit for a predetermined period of time while rotating the turntable. A boron-containing gas is supplied from the first gas supplying unit to the surface of the substrate while rotating the turntable after finishing the step of forming the seed layer on the surface of the substrate. A silane-based gas is supplied from the second process gas supplying unit to the surface of the substrate while rotating the turntable and causing silicon atoms contained in the silane-based gas to bond with each other on the surface of the substrate by a catalytic action of the boron-containing gas.

13 Claims, 22 Drawing Sheets

| | S1 WAFER ROT (NOBLE GAS) | S2 SEED | S3 NOBLE GAS PURGE | S4 $B_2H_6$ | S5 GAS ISO. | S6 $Si_2H_6$ | S7 GAS ISO. | S8 GREEN AREA (NOBLE GAS) | S9 GAS ISO. |
|---|---|---|---|---|---|---|---|---|---|
| w/o AMINOSILANE SEED | ↑ | × | × | ↑ | ↑ | ↑ | ↑ | ↑ | ↑ |
| WITH AMINOSILANE SEED | ↑ | ↑ | ↑ | ↑ | ↑ | ↑ | ↑ | ↑ | ↑ |

ALD LOOP

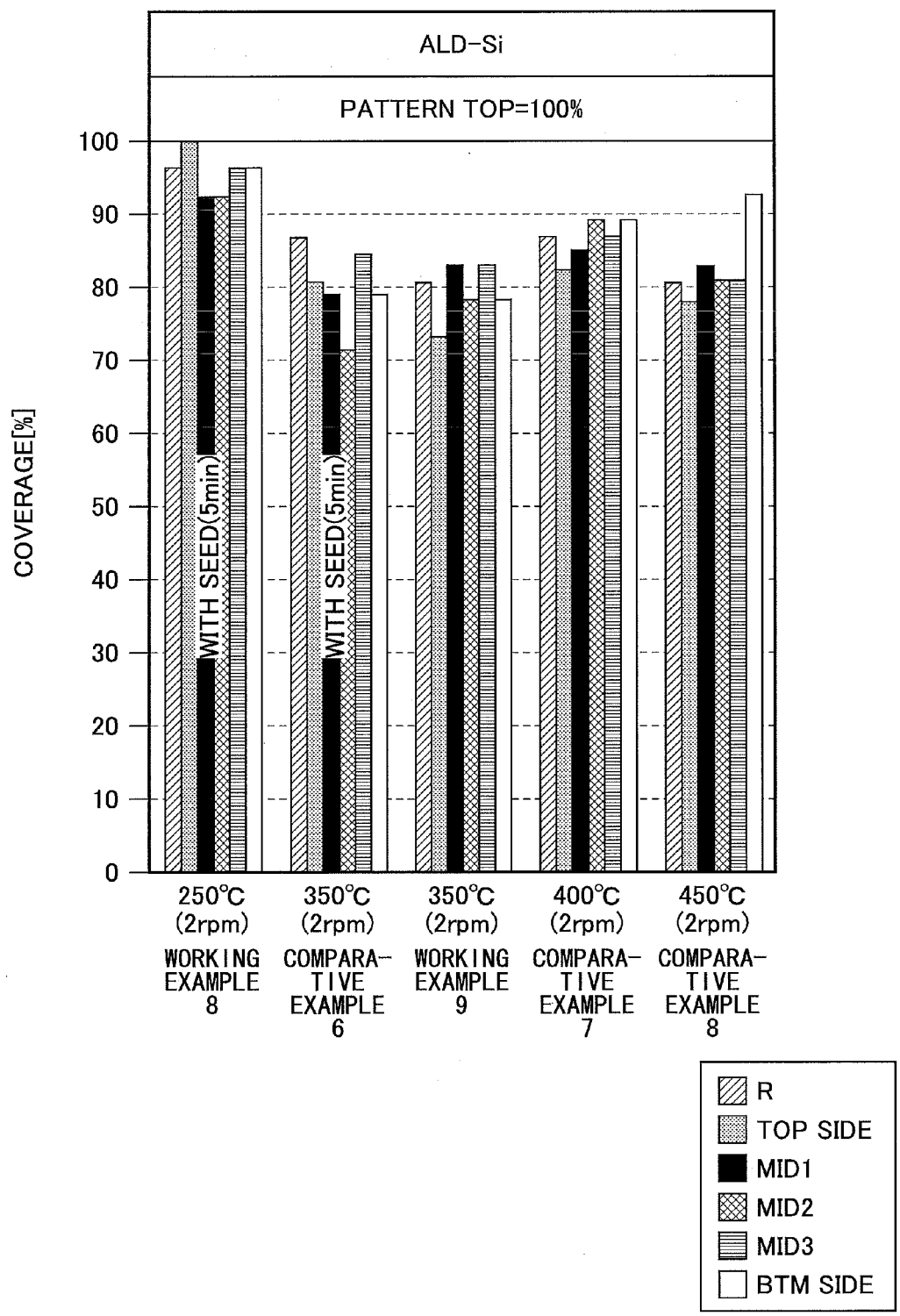

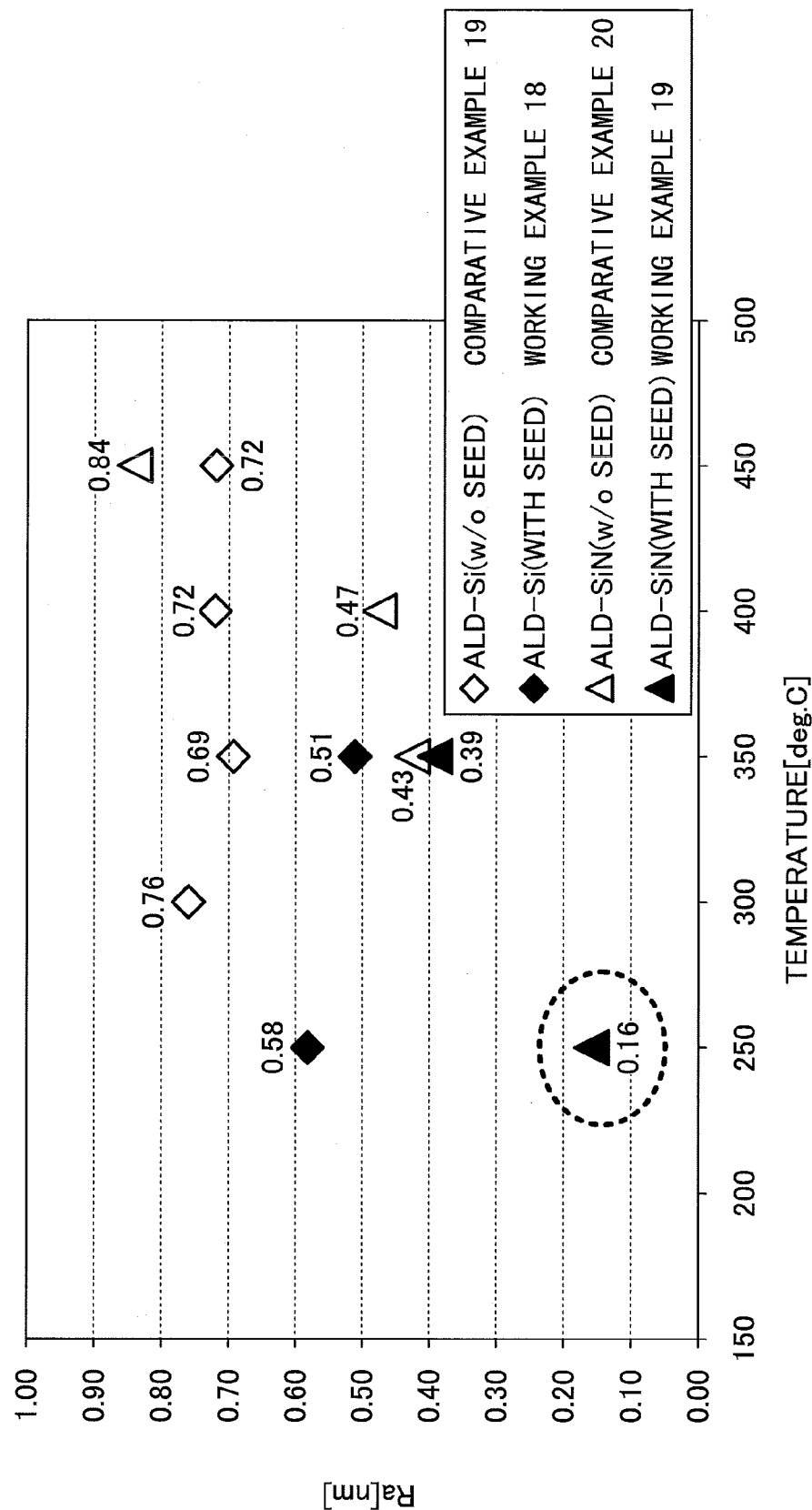

METHOD OF DEPOSITING A SILICON-CONTAINING FILM

CROSS-REFERENCE TO RELATED APPLICATION

The present application is based upon and claims the benefit of priority of Japanese patent application No. 2015-36142, filed on Feb. 26, 2015, the entire contents of which are incorporated by reference in their entirety.

BACKGROUND OF THE PRESENT INVENTION

1. Field of the Present Invention

The present invention relates to a method of depositing a silicon-containing film.

2. Description of the Related Art

Conventionally, a vertical-type thermal processing apparatus is known that horizontally holds a plurality of wafers on a wafer boat so as to stack the wafers at intervals in a vertical direction like shelves, and accommodates the wafer boat holding the wafers in a vertically long process chamber. Then, a film is deposited on the wafers by supplying a predetermined gas into the process chamber and heating the process chamber.

Japanese Laid-Open Patent Application Publication No. 2011-254063 discloses a film deposition method using such a vertical-type thermal processing apparatus. In the film deposition method, a silicon film containing impurities in an amorphous state is deposited by alternately repeating a first gas supply process of supplying a silane-based gas composed of silicon and hydrogen into a process chamber so as to cause the silane-based gas to adsorb on a surface of an object to be processed and a second gas supply process of supplying a gas containing impurities such as $BCl_3$ and the like into the process chamber.

Similarly, Japanese Laid-Open Patent Application Publication No. 2010-251654 discloses a film deposition method using the vertical-type thermal processing apparatus. In this method, a silicon nitride film containing boron is deposited by repeating a first process of forming a silicon nitride layer containing boron by supplying a silane-based gas (DCS, Dichlorosilane), a nitriding gas ($NH_3$), and a boron-containing gas ($BCl_3$) to a substrate in this order while purging the substrate with $N_2$, and a second process of supplying a nitriding gas activated by plasma (activated $NH_3$) to the silicon nitride layer containing boron in this order.

In the above-mentioned vertical-type thermal processing apparatus, because the inside of the process chamber is not divided, when different types of gases are supplied into the process chamber, the different gases mix and react with each other in the process chamber. To prevent such a reaction, in the film deposition method disclosed in Japanese Laid-Open Patent Application Publication No. 2011-254063, the supply of the silane-based gas is stopped while performing the purge process to expel the remaining silane-based gas after performing the first gas supply process, and then the supply of the gas containing the impurities is stopped while performing the purge process to expel the remaining gas containing the impurities after finishing the second gas supply process in order to alternately perform the first gas supply process and the second gas supply process. These series of processes are made in one cycle, and the film deposition is performed by repeating the above-mentioned cycle up to a predetermined number of times.

Similarly, even in the film deposition method disclosed in Japanese Laid-Open Patent Application Publication No. 2010-251654, as discussed above, a process of purging the substrate with $N_2$ is performed between each of the processes of supplying the silane-based gas, the nitriding gas and the boron-containing gas, and one cycle is formed by adding a process of supplying the activated nitriding gas to the above-mentioned processes. The film is deposited by repeating this cycle.

In such a film deposition method, a first reaction gas is supplied to a substrate so as to cause the first reaction gas to adsorb on a surface of the substrate, and then a second reaction gas is supplied to the substrate so as to cause the second reaction gas to react with the first process gas adsorbed on the surface of the substrate, thereby depositing a film composed of a reaction product of the first and second reaction gases. This film deposition method is referred to as Atomic Layer Deposition (ALD) or Molecular layer Deposition (MLD).

However, in the above-mentioned configurations disclosed in Japanese Laid-Open Patent Application Publication No. 2011-254063 and Japanese Laid-Open Patent Application Publication No. 2010-251654, because the supply and the stop of the gas are frequently repeated, a substantial period of time is required to perform even one cycle. Moreover, this cycle needs to be repeated a plurality of number of times to deposit a film having a predetermined film thickness, which requires a very long period of time and substantially decreases productivity.

On the other hand, as disclosed in Japanese Laid-Open Patent Application Publication No. 2010-263245, a turntable-type film deposition apparatus is known as a film deposition apparatus to perform the above-mentioned ALD or MLD. Such a turntable-type film deposition apparatus includes a turntable on which a substrate is placed, a first reaction gas supply part to supply a first reaction gas to the turntable, a second reaction gas supply part to supply a second reaction gas to the turntable, and a separation area provided at a location between the first reaction gas supply part and the second reaction gas supply part to separate the first reaction gas from the second reaction gas. The separation area has a ceiling surface lower than ceiling surfaces of an area where the first reaction gas is supplied and an area where the second is supplied, and includes a separation gas supply part to supply a separation gas.

The turntable-type film deposition apparatus using ALD or MLD can perform the film deposition method disclosed in Japanese Laid-Open Patent Application Publication No. 2011-254063 and Japanese Laid-Open Patent Application Publication No. 2010-251654 with high productivity. More specifically, the turntable-type film deposition apparatus can perform the above-mentioned one cycle by one revolution of the turntable, and the plurality of cycles can be continued by rotating the turntable multiple number of times of revolutions without stopping the supply of the gases.

However, because the turntable-type film deposition apparatus differs from the above-discussed vertical-type thermal processing apparatus in apparatus configuration and temperature conditions in the film deposition process, a high-quality film cannot be necessarily obtained even if the turntable-type film deposition apparatus performs the film deposition method disclosed in Japanese Laid-Open Patent Application Publication No. 2011-254063 and Japanese Laid-Open Patent Application Publication No. 2010-251654.

SUMMARY OF THE PRESENT DISCLOSURE

According to embodiments of the present invention, there is provided a method of depositing a silicon-containing film that can deposit a high-quality silicon-containing film by using a turntable-type film deposition apparatus utilizing ALD or MLD.

According to an embodiment, there is provided a method of depositing a silicon-containing film using a film deposition apparatus. The apparatus includes a turntable provided in a process chamber and configured to receive a substrate thereon, first and second process areas provided apart from each other along a rotational direction of the turntable, a first process gas supplying unit configured to supply a first process gas to the substrate in the first process area, and a second process gas supplying unit configured to supply a second process gas to the substrate in the second process area. In the method, a seed layer is formed on a surface of the substrate by supplying an aminosilane gas from the first process gas supplying unit for a predetermined period of time while rotating the turntable. A boron-containing gas is supplied as a catalytic gas from the first gas supplying unit to the surface of the substrate while rotating the turntable after finishing the step of forming the seed layer on the surface of the substrate. A silane-based gas is supplied as a source gas from the second process gas supplying unit to the surface of the substrate while rotating the turntable and causing silicon atoms contained in the silane-based gas to bond with each other on the surface of the substrate by a catalytic action of the boron-containing gas.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 13A and 13B are diagrams showing a result of having performed a third working example of the present invention;

FIG. 20 is a graph showing a result of surface roughness of a film obtained by performing a method of depositing a silicon-containing film according to an eighth practical example of the present invention.

DETAILED DESCRIPTION OF PREFERRED EMBODIMENTS

A description is given below of embodiments of the present disclosure with reference to the accompanying drawings.

Figure 1:
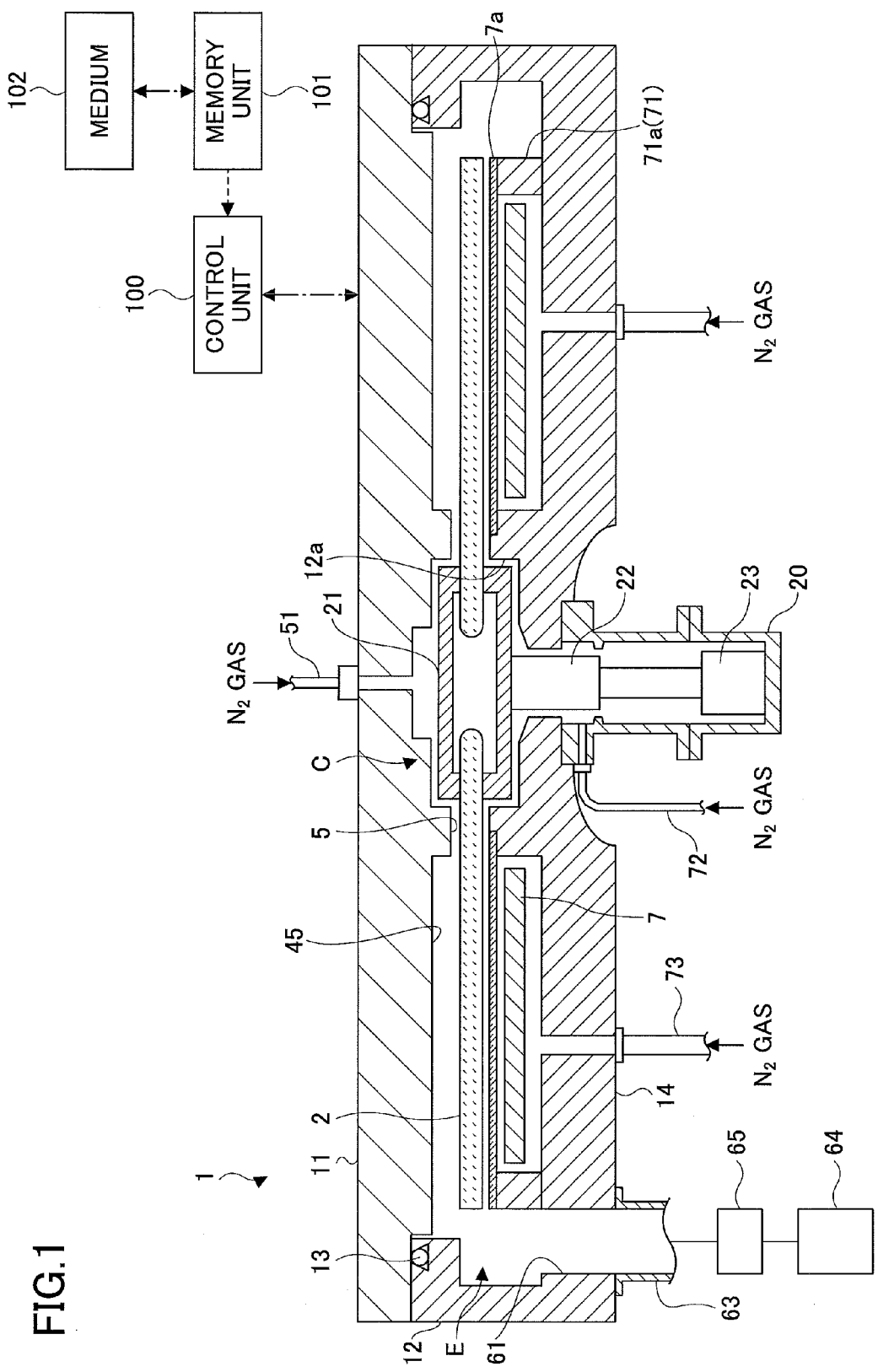
FIG. 1 is a schematic cross-sectional view of a film deposition apparatus according to an embodiment of the present invention.
Figure 2:
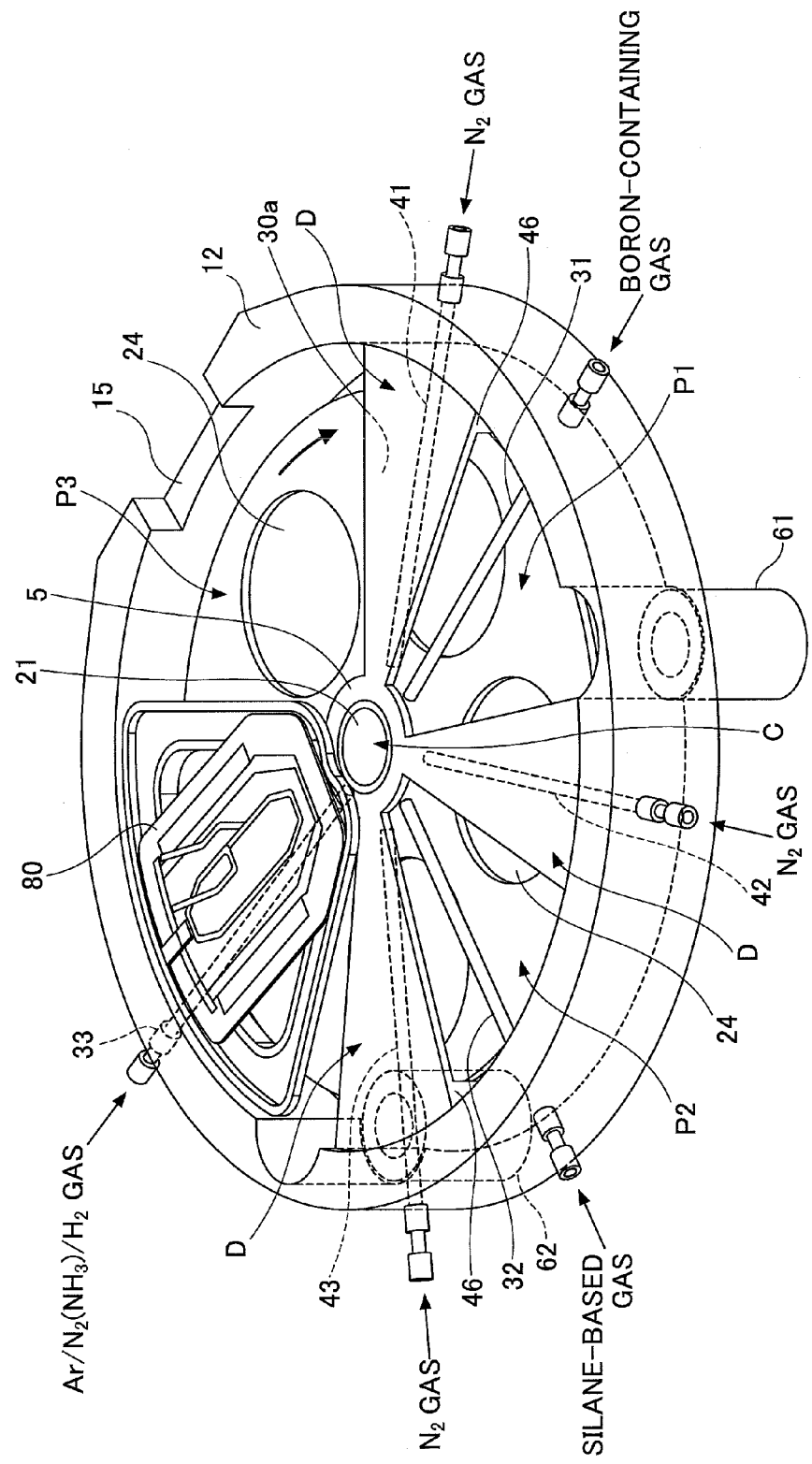
FIG. 2 is a schematic perspective view illustrating a configuration in a vacuum chamber of the film deposition apparatus of FIG. 1.
Figure 3:
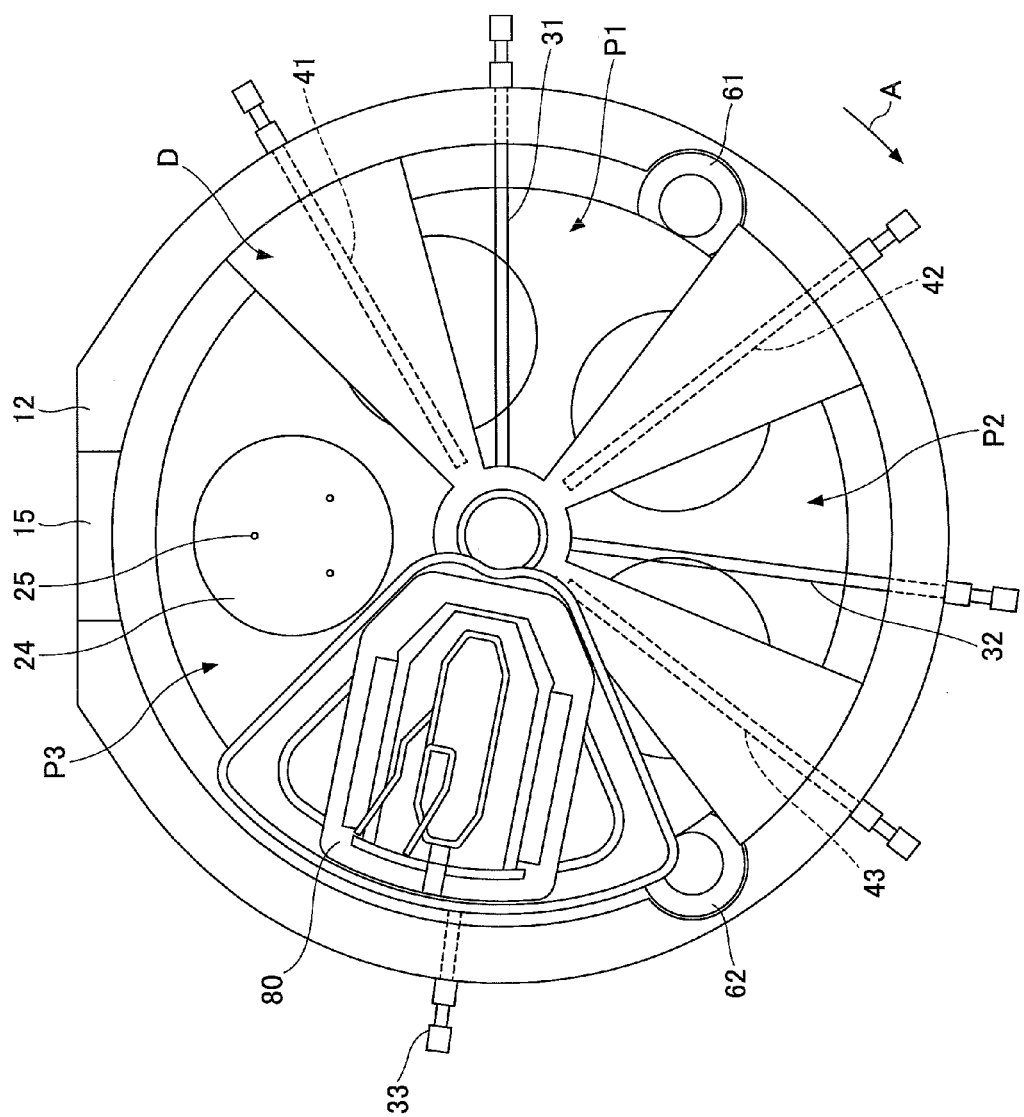
FIG. 3 is a schematic plan view illustrating a configuration in the vacuum chamber of the film deposition apparatus of FIG. 1.

To begin with, a description is given below of a film deposition apparatus preferred to perform a method of depositing a silicon-containing film according to an embodiment of the present invention. FIG. 1 is a vertical cross-sectional view of an example of a film deposition apparatus, and FIG. 2 is an exploded perspective view of an example of the film deposition apparatus. FIG. 3 is a exploded top view of an example of the film deposition apparatus.

With reference to FIGS. 1 through 3, a film deposition apparatus that can perform a method of depositing a silicon-containing film according to an embodiment of the present invention is provided with a vacuum chamber 1 having a flattened cylindrical shape, and a turntable 2 that is located inside the chamber 1 and has a rotational center at a center of the vacuum chamber 1. The vacuum chamber 1 includes a chamber body 12 having a cylindrical shape with a closed bottom and a ceiling plate 11 that is detachably placed on the upper end part of the chamber body 12 via a sealing member such as an O ring 13 (see FIG. 1). Because the vacuum chamber 1 is a chamber to process a wafer W thereinside, the vacuum chamber 1 may be also referred to as a process chamber 1.

The turntable 2 is rotatably fixed to a cylindrical shaped core portion 21 at the center part. The core portion 21 is fixed on an upper end of a rotational shaft 22 that extends in a vertical direction. The rotational shaft 22 passes through a bottom part 14 of the chamber body 12 and is fixed at the lower end part to a driving mechanism 23 that can rotate the rotational shaft 22 (see FIG. 1) in a clockwise fashion. The rotational shaft 22 and the driving mechanism 23 are housed in a case body 20 having a cylindrical shape with a closed bottom. The case body 20 is hermetically fixed to a bottom surface of the bottom part 14, which isolates an inner environment of the case body 20 from an outer environment.

As illustrated in FIGS. 2 and 3, plural (five in the illustrated example) circular concave portions 24, each of which receives a semiconductor wafer W (referred to as a wafer W hereinafter), are formed in an upper surface of the turntable 2. The concave portions 24 are located along a circumferential direction.

Incidentally, only one wafer W is illustrated in FIG. 3. Each of the concave portions 24 has a diameter slightly larger, for example by 4 mm, than the diameter of the wafer W and a depth substantially equal to a thickness of the wafer W. Therefore, when the wafer W is placed in the concave portion 24, a surface of the wafer W is as high as a surface of an area of the turntable 2 other than the concave portions 24. For example, three through holes 25 are formed in the bottom of the concave portion 24 to allow three corresponding lift pins (not illustrated) to pass therethough. The lift pins support a back surface of the wafer W and raise and lower the wafer W.

FIGS. 2 and 3 are diagrams for explaining the structure inside the vacuum chamber 1, and the ceiling plate 11 is not illustrated for the sake of explanation. As illustrated in FIGS. 2 and 3, process gas nozzles 31 through 33 and separation gas nozzles 41 through 43, all of which are made of, for example, quartz, are provided above the turntable 2 at predetermined angular intervals along the circumferential direction of the vacuum chamber 1 (or a rotational direction of the turntable (an arrow A in FIG. 3)). In the illustrated example, the separation gas nozzle 41, the process gas nozzle 31, the separation gas nozzle 42, the process gas nozzle 32, the separation gas nozzle 43 and the process gas nozzle 33, are arranged in this order in a clockwise fashion when seen from above. These gas nozzles 31 through 33, 41 through 43 pass through a circumferential wall part of the chamber body 12 and are introduced into the vacuum chamber 1 by fixing base ends of the gas nozzles 31 through 33, 41 through 43, which are gas inlet ports 92a, 31a, 32a, 41a, 42a, to the outer circumferential wall of the chamber body 12. The gas nozzles 31 through 33, 41 through 43 are installed so as to horizontally extend along a radial direction substantially parallel with the turntable 2.

Above the process gas nozzle 33, a plasma generator 80 is provided as schematically illustrated in FIG. 3. The plasma generator 80 is described later.

Although not illustrated, the process gas nozzle 31 is connected to a gas supplying source of a boron-containing gas as a first process gas via a pipe and a flow rate controller and the like (not illustrated). The process gas nozzle 32 is connected to a gas supplying source of a Si (silicon)-containing gas as a second process gas via a pipe and a flow rate controller and the like (not illustrated). The process gas nozzle 33 is connected to a gas supplying source of a nitriding gas as a third process gas via a pipe and a flow rate controller and the like (not illustrated). The separation gas nozzles 41 through 43 are connected to a gas supplying source of nitrogen ($N_2$) gas as a separation gas via a pipe and a flow rate controller and the like (not illustrated).

The process gas nozzle 32 is configured to be connectable with a gas supplying source of an aminosilane gas to form a seed layer in addition to a source gas (silane-based gas) for film deposition to deposit a silicon-containing film. In the method of depositing the silicon-containing film according to the embodiment, to begin with, a seed layer is formed on a surface of a wafer W, and then a silicon-containing film composed mostly of silicon is deposited on the surface of the wafer W. Because the process gas for seed layer formation is an aminosilane gas, both gases are the silane-based gas. A switch between the aminosilane gas for seed layer formation and the silane-based gas for film deposition may be performed by switching the gas supplying source to be connected to the process gas nozzle 32 by using a valve (not illustrated).

For example, (diisopropylamino)silane gas may be used as the aminosilane gas for seed layer formation. For example, a high order of silane-based gas such as $SiH_4$, $Si_2H_6$, $Si_3H_8$ can be used as the silane-based gas for film deposition. Moreover, the boron-containing gas supplied from the first process gas nozzle 31 is a catalytic gas to create a bond between silicon atoms by using a catalytic function of boron. For example, $BH_3$, $B_2H_6$, $B(CH_3)_3$ or $BCl_3$ may be used as the boron-containing gas. The nitriding gas supplied from the process gas nozzle 33 is a gas for generating a silicon nitride film by nirtiding a film mostly composed of silicon, and is supplied by being activated by plasma. For example, a mixed gas containing a nitrogen-containing gas such as $N_2$ gas, $NH_3$ gas may be used as the nitriding gas. Here, the process gas nozzle 33 is a process gas supply unit needed when depositing a nitride film, and does not have to be provided when not depositing the nitride film but depositing only a Si film. Hence, the process gas nozzle 33 may be provided as necessary.

The process gas nozzles 31, 32 and 33 have a plurality of gas discharge holes 35 to discharge the corresponding process gases toward the turntable 2. The plurality of gas discharge holes 35 are arranged in lengthwise directions of the process gas nozzles 31, 32 and 33 at predetermined intervals, for example, about 10 mm. An area below the process gas nozzle 31 may be referred to as a first process area P1 in which the boron-containing gas is adsorbed on the wafer W, and an area below the process gas nozzle 32 may be referred to as a second process area P2 in which a bond between silicon atoms contained in the supplied silane-based gas is created by catalysis of the boron-containing gas adsorbed on the wafer W in the first process area P1, thereby depositing a silicon film on the wafer W.

With reference to FIGS. 2 and 3, three convex portions 4 are provided in the vacuum chamber 1. Each of convex portions 4 is attached to the lower surface of the ceiling plate 11 so as to protrude toward the turntable 2 to forma separation area D with each of the separation gas nozzles 41 through 43 as described later. Moreover, each of the convex portions 4 has a truncated sectorial planar shape. In the illustrated film deposition apparatus, an inner arc of each of the convex portions 4 is coupled to a protrusion part 5 (described later) and an outer arc of each of the convex portions 4 is arranged along the inner circumferential wall of the chamber body 12.

Figure 4:
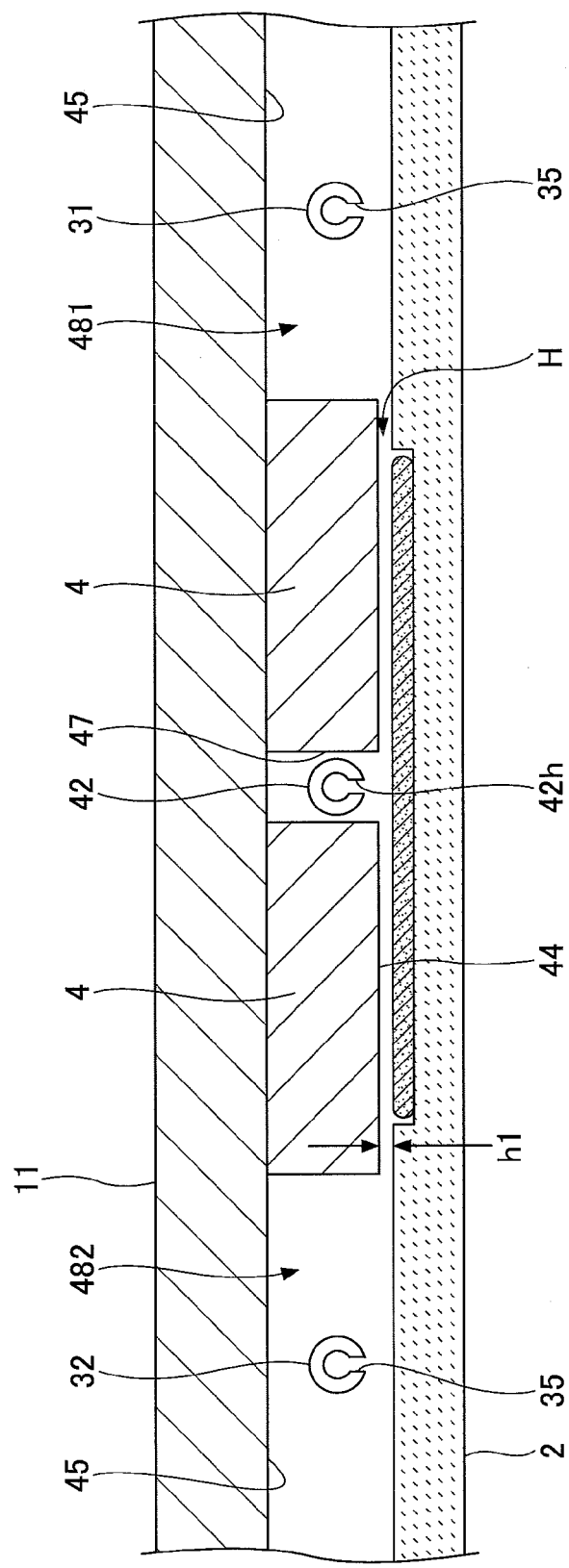
FIG. 4 is a schematic cross-sectional view of the vacuum chamber along a concentric circle of the rotatable turntable provided in the vacuum chamber of the film deposition apparatus of FIG. 1.

FIG. 4 illustrates a cross-sectional view of the vacuum chamber 1 along a concentric circle of the turntable 2 from the process gas nozzle 31 to the process gas nozzle 32. As illustrated in FIG. 4, because the convex portions 4 are attached to the back surface of the ceiling plate 11, there are flat lower ceiling surfaces 44 (first ceiling surfaces) that are lower surfaces of the convex portions 4 and ceiling surfaces 45 (second ceiling surfaces) higher than the ceiling surfaces 44 located on both sides of the ceiling surfaces 44 in the vacuum chamber 1. Each of the lower surfaces 44 has a truncated sectorial planar shape. In addition, as illustrated in FIG. 4, the convex portion 4 has a groove portion 47 formed at the center part in the circumferential direction while extending in the radial directions of the convex portions 4. The separation gas nozzle 42 is housed in the groove portion 47. The other convex portions 4 similarly have groove portions 47 and house the separation gas nozzles 41, 43 therein. In addition, the process gas nozzles 31, 32 are arranged below the higher ceiling surfaces 45. Specifically, the process gas nozzles 31, 32 are arranged apart from the higher ceiling surfaces 45 and near the upper surface of the wafer W or the turntable 2. As illustrated in FIG. 4, the process gas nozzle 31 is provided in right-hand space 481 under the higher ceiling surface 45, and the process gas nozzle 32 is provided in left-hand space 482 under the higher ceiling surface 45.

Each of the separation gas nozzles 41, 42 housed in the groove portion 47 has a plurality of discharge holes 42h (see FIG. 5) open toward the turntable 2. The plurality of discharge holes 42h are arranged in a lengthwise direction of each of the separation gas nozzles 41, 42 at predetermined intervals, for example, about 10 mm.

The lower ceiling surfaces 44 create a separation space H, which is a narrow space relative to the upper surface of the turntable 2. When $N_2$ gas is supplied from the discharge holes 42h of the separation gas nozzle 42, supplied $N_2$ gas flows toward the spaces 481, 482 through the separation space H. At this time, because a volume of the separation space H is smaller than volumes of the spaces 481, 482, a pressure of the separation space H through which the $N_2$ gas flows can be higher than pressures of the spaces 481, 482. Hence, a pressure wall can be created between the spaces 481, 482 as the separation space H. In addition, $N_2$ gas flowing from the separation space H to the spaces 481, 482 serves as a counter flow against the Si-containing gas from the first process area P1 and the oxidization gas from the second process area P2. Accordingly, the Si-containing gas from the first process area P1 and the oxidization gas from the second process area P2 are separated by the separation space H. Thus, the Si-containing gas and the oxidization gas are prevented from being intermixed and reacting with each other in the vacuum chamber 1.

In FIG. 4, only the separation gas nozzle 42 is illustrated because of space limitations, and the description has been given of the separation gas nozzle 42. Because the separation gas nozzles 41 and 43 have the same configuration as the separation gas nozzle 42, the description thereof is omitted.

It is preferable to set the height h1 of the ceiling surface 44 with respect to the upper surface of the turntable 2 to be a height that can make the pressure in the separation space H to be higher than the pressure of the spaces 481 and 482 in consideration of the pressure in the vacuum chamber when depositing a film, rotational speed of the turntable 2, and the flow rate of the separation gas ($N_2$ gas).

As shown in FIGS. 2 and 3, a ring-shaped protrusion portion 5 is provided on a lower surface of the ceiling plate 11 so as to surround the outer circumference of the core portion 21 fixing the turntable 2. In this embodiment, the protrusion portion 5 continues to a part of the convex portion 4 at the side of the rotational center, and a lower surface of the protrusion portion 5 is formed to have the same height as the lower surface of the ceiling surface 44. In other words, the lower surface of the protrusion portion 5 and the lower surface of the convex portion 4 form one plane surface.

Figure 5:
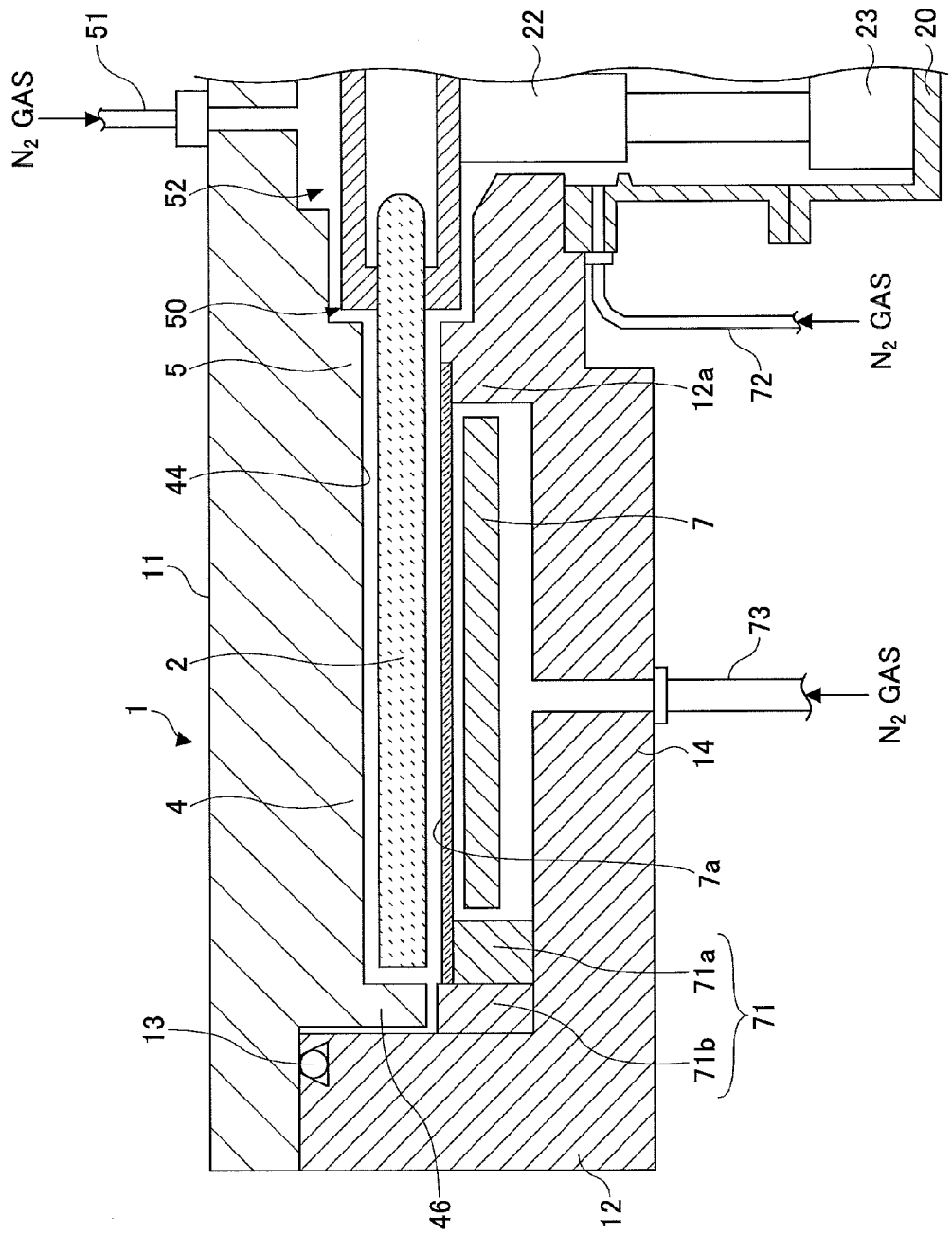
FIG. 5 is another schematic cross-sectional view of the film deposition apparatus of FIG. 1.

FIG. 5 is a cross-sectional view illustrating a part of the vacuum chamber 1 where the lower ceiling surface 44 is provided. As illustrated in FIG. 5, a bent portion 46 bent into an L shape is provided at the outer peripheral part of the sectorial convex portion 4 (location at outer peripheral side of the vacuum chamber 1) so as to face the outer circumference of the turntable 2. The bent portion 46 prevents the process gases from being intermixed by preventing the process gases from entering from both sides of the separation areas D as well as the convex portions 4. Because the convex portion 4 is attached on the lower surface of the ceiling plate 11, which can be removed from the chamber body 12, there needs to be a clearance between an outer circumferential wall of the bent portion 46 and the inner circumferential wall of the chamber body 12. A clearance between an inner circumferential surface of the bent portion 46 and an outer circumferential surface of the turntable 2 and the clearance between an outer circumferential wall of the bent portion 46 and the inner circumferential surface of the chamber body 12 is, for example, set to be the same as the height h1 of the lower ceiling surface 44 with respect to the upper surface of the turntable 2.

As illustrated in FIG. 5, while the inner circumferential wall of the chamber body 12 is formed into a vertical surface closer to the outer circumferential surface of the bent portion 46 in the separation area D, the inner circumferential wall of the chamber body 12 is recessed outwards in a region from a location opposing the outer circumference of the turntable 2 to the bottom part 14 of the chamber body 12 in an area except for the separation area D, as illustrated in FIG. 1. In the following description, the recessed part having substantially a rectangular cross-sectional shape may be referred to as an evacuation area, for the sake of explanation. Specifically, an evacuation area that is in communication with the first process area P1 is referred to as a first evacuation area E1; and an evacuation area that is in communication with the second process area P2 is referred to as a second evacuation area E2. In bottom parts of the first evacuation area E1 and the second evacuation areas E2, a first evacuation port 61 and a second evacuation port 62 are formed, respectively, as illustrated in FIGS. 1 through 3. Each of the first evacuation port 61 and the second evacuation port 62 is connected to a vacuum pump 64 serving as an evacuation apparatus via an evacuation pipe 63, as illustrated in FIG. 1. Incidentally, as illustrated in FIG. 1, a pressure controller 65 is connected to the evacuation pipe 63.

As illustrated in FIGS. 1 and 5, a heater unit 7 serving as a heating means is provided in a space between the turntable 2 and the bottom part 14 of the chamber body 12 so as to heat the wafers W placed on the turntable 2 through the turntable 2 up to a temperature (e.g., 250° C.) specified in a process recipe. In addition, a ring-shaped cover member 71 is provided below and near the outer circumference of the turntable 2 in order to separate an atmosphere of the space where the heater unit 7 is placed from an atmosphere of a region from a space above the turntable 2 to the evacuation area, thereby preventing gases from entering the space under the turntable 2 (see FIG. 5). Specifically, the cover member 71 includes an inner member 71a and an outer member 71b. The inner member 71a is arranged below and along the peripheral area of the turntable 2 so as to reach even an area beyond the periphery of the turntable 2, and the outer member 71b is arranged between the inner member 71a and the inner circumferential surface of the chamber body 12.

Specifically, the outer member 71b is provided under the bent portion 46 formed in the peripheral part of the convex portions 4 in the separation areas D and close to the bent portion 46. The inner member 71a surrounds the entire space where the heater unit 7 is placed by being provided at the peripheral part under the turntable 2 (and in the area below the turntable 2 slightly beyond the periphery of the turntable 2).

The bottom part 14, at a location closer to the rotational center than the space including the heater unit 7, includes a protrusion part 12a that protrudes toward the core portion 21 arranged near the center of the lower surface of the turntable 2. A narrow space is formed between the protrusion part 12a and the core portion 21. In addition, there is formed a narrow gap between the rotational shaft 22 and the inner circumferential surface of a through hole that allows the rotational shaft 22 to pass therethrough. The narrow space and the narrow gap are in communication with the case body 20. A purge gas supplying pipe 72 is connected with the case body 20 to supply $N_2$ gas, which is a purge gas, into the case body 20 in order to purge the inside of the case body 20, the gap, and the narrow space. In addition, a plurality of purge gas supplying pipes 73 are provided in the bottom part 14 of the vacuum chamber 1 in areas under the heater unit 7 at predetermined angular intervals in order to purge the space where the heater unit 7 is placed. Incidentally, only one purge gas supplying pipe 73 is illustrated in FIG. 5 for the sake of illustration. In addition, a lid member 7a having a ring shape is provided between the turntable 2 and the heater unit 7. The lid member 7a covers from the inner circumferential wall of the outer member 71b (upper surface of the inner member 71a) to the top end of the protrusion part 12a throughout the whole circumference to prevent the process gases from entering the area including the heater unit 7. The lid member 7a is made of, for example, quartz.

In addition, a separation gas supplying pipe 51 is connected to the top center portion of the ceiling plate 11 of the vacuum chamber 1, so that $N_2$ gas as a separation gas is supplied to a space 52 between the ceiling plate 11 and the core portion 21. The separation gas supplied to the space 52 flows through a narrow gap 50 between the protrusion portion 5 and the turntable 2 and then along the upper surface of the turntable 2 toward the outer circumference of the turntable 2. The narrow space 50 can be maintained by $N_2$ gas at a pressure higher than pressures in the spaces 481, 482. Accordingly, the boron-containing gas supplied to the first process area P1 and the silane-based gas supplied to the second process area P2 are prevented from being intermixed with each other through the center area C by the narrow space 50 maintained at a higher pressure. In other words, the narrow space 50 (or the center area C) functions in the same manner as the separation space H (or the separation area D).

In addition, a transfer opening 15 is formed in a side wall of the chamber body 12 as illustrated in FIGS. 2 and 3. Through the transfer opening 15, the wafer W is transferred into or out of the vacuum chamber 1 by an external transfer arm (not illustrated). The transfer opening 15 is provided with a gate valve (not illustrated) by which the transfer opening 15 is opened or closed. When the concave portion 24 of the turntable 2 is in alignment with the transfer opening 15 and the gate valve is opened, the wafer W is transferred into the vacuum chamber 1 and placed in the concave portion 24 that is a wafer receiving portion of the turntable 2 from the transfer arm. In order to lower/raise the wafer W into/from the concave portion 24, there are provided lift pins that are raised or lowered through corresponding through holes (not illustrated) formed in the concave portion 24 of the turntable 2 by a lifting mechanism (not illustrated).

Figure 6:
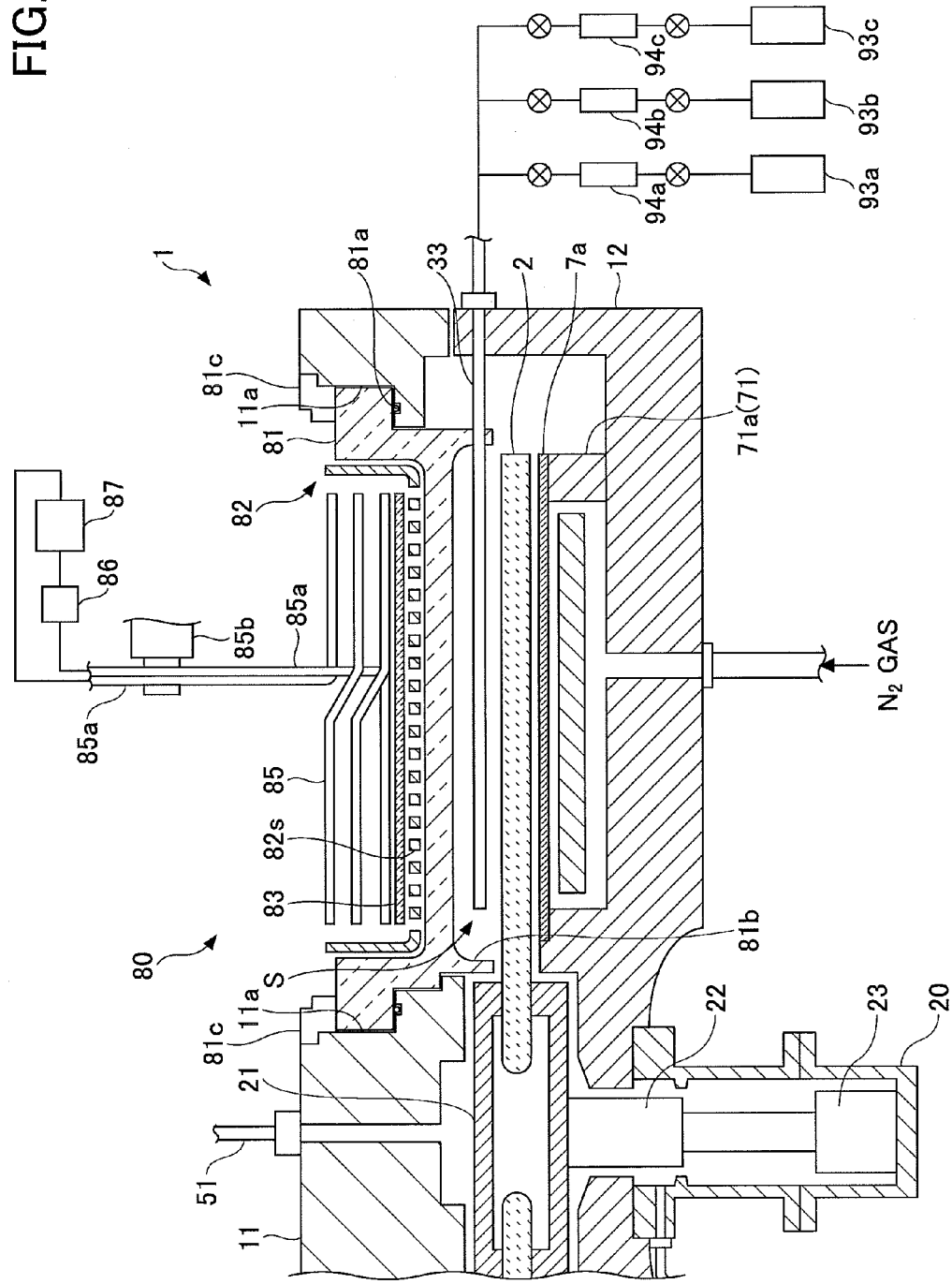
FIG. 6 is a schematic cross-sectional view illustrating a plasma generator provided in the film deposition apparatus of FIG. 1.
Figure 7:
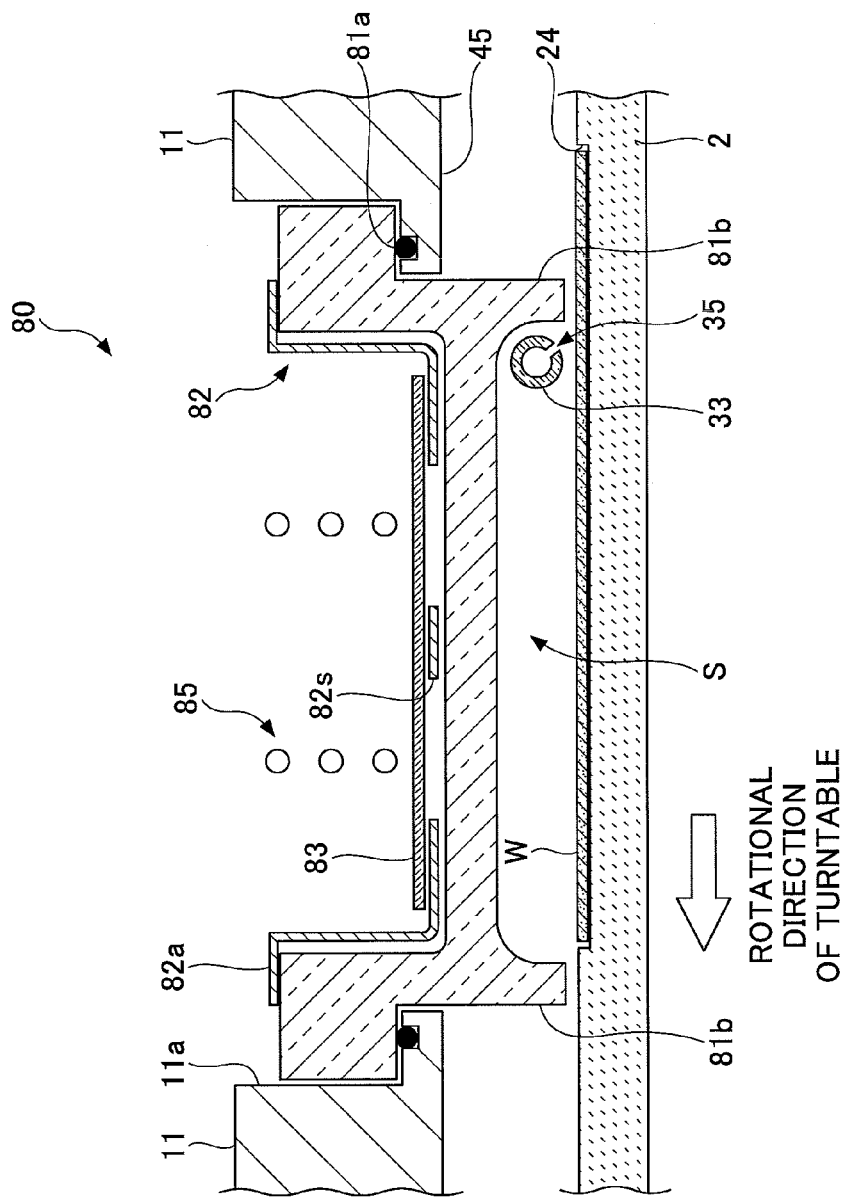
FIG. 7 is another schematic cross-sectional view illustrating a plasma generator provided in the film deposition apparatus of FIG. 1.
Figure 8:
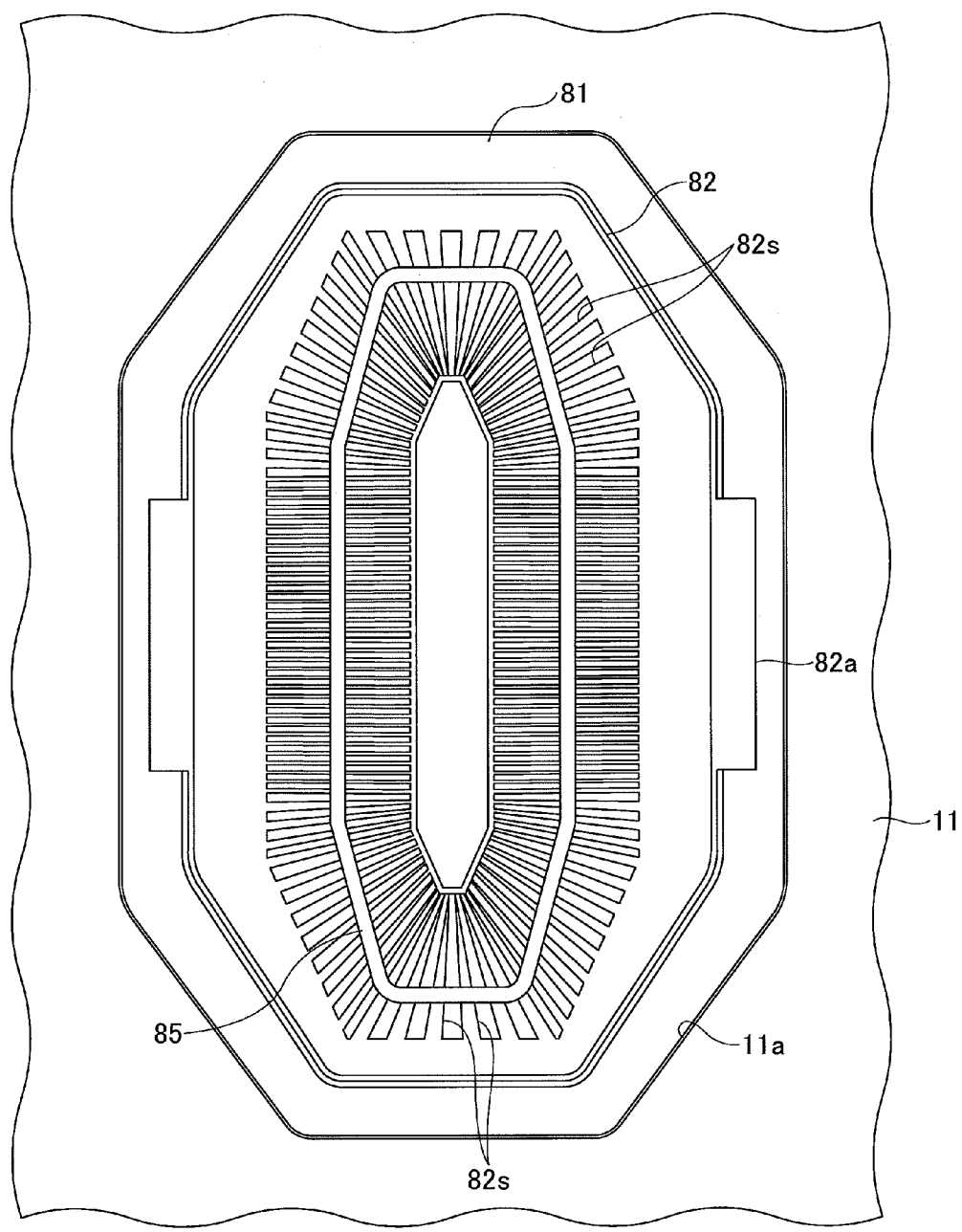
FIG. 8 is a schematic top view illustrating a plasma generator provided in the film deposition apparatus of FIG. 1.

Next, the plasma generator 80 is described with reference to FIGS. 6 through 8. FIG. 6 is a schematic cross-sectional view of the plasma generator 80 along the radial direction of the turntable 2. FIG. 7 is a schematic cross-sectional view of the plasma generator 80 along the direction perpendicular to the radial direction of the turntable 2. FIG. 8 is a schematic top view of the plasma generator 80. For the sake of convenience of drawing, a part of the members is omitted in these figures.

With reference to FIG. 6, the plasma generator 80 is made of a high-frequency wave transmissible material, and includes: a frame member 81 that has a concave part recessed from the upper plane and that is engaged in an opening part 11a formed on the ceiling plate 11; a Faraday shielding plate 82 that is accommodated in a concave part of the frame member 81 and that has an almost-box shape having an opening on the upper part; and an insulating plate 83 placed on the bottom surface of the Faraday shielding plate 82, and a coil-like antenna 85 that is supported above the insulating plate 83 and that has an almost octagonal-shaped upper surface shape when viewed from the top.

The opening part 11a of the ceiling plate 11 includes a plurality of step parts. One of the step parts is provided with a groove part around the whole circumference. A sealing member 81a such as an O-ring, for example, is fitted into the groove part. The frame member 81 includes a plurality of step parts corresponding to the step parts of the opening part 11a. The frame member 81 is fitted into the opening part 11a so that a back side of a step part of the plurality of step parts contacts the seal member 81a fitted in the groove part of the opening part 11a. Accordingly, airtightness between the ceiling plate 11 and the frame member 81 is maintained. Also, as illustrated in FIG. 6, a pressing member 81c is provided along the outer circumference of the frame member 81 fitted in the opening part 11a of the ceiling plate 11. Accordingly, the frame member 81 is pressed downward to the ceiling plate 11. Accordingly, airtightness between the ceiling plate 11 and the frame member 81 is maintained more securely.

The lower surface of the frame member 81 is opposite to the turntable 2 in the vacuum chamber 1. A projection part 81b that projects downward is provided around the whole outer circumference of the lower surface. The lower surface of the projection part 81b is provided near the surface of the turntable 2, so that a space (to be referred to as an internal space S) is formed above the turntable 2 by the projection part 81b, the surface of the turntable 2, and the lower surface of the frame member 81. The interval between the lower surface of the projection part 81b and the surface of the turntable 2 may be almost the same as the height h1 of the ceiling surface 11 with respect to the upper surface of the turntable 2 in the separation space H (see FIG. 4).

The process gas nozzle 33 that passes through the projection part 81b extends into the internal space S. As illustrated in FIG. 6, an argon gas supply source 93a in which argon (Ar) gas is filled, an nitrogen gas supply source 93b in which nitrogen ($N_2$) gas is filled, and a hydrogen gas supply source 93c in which hydrogen ($H_2$) gas is filled are connected to the process gas nozzle 33. Flow rates of Ar gas, $N_2$ gas and $H_2$ gas from the argon gas supply source 93a, the nitrogen gas supply source 93b and the hydrogen gas supply source 93c are controlled by flow rate controllers 94a, 94b and 94c, respectively, and the flow-controlled gasses are supplied to the internal space S at a predetermined flow rate ratio (mixture ratio). Here, the nitrogen gas supply source 93b in which nitrogen gas is filled may be an ammonia gas supply source 93b in which ammonia gas is filled instead of nitrogen gas. In other words, the nitrogen gas supply source 93b just has to function as a nitriding gas supply source 93b in which a nitriding gas is filled.

The process gas nozzle 33 is provided with a plurality of discharge holes 35 at predetermined intervals (10 mm, for example) along the lengthwise direction thereof. The above-mentioned argon (Ar) gas and the like are discharged from the gas discharge holes 35. As illustrated in FIG. 8, the gas discharge hole 35 is inclined toward the upstream side of the rotation direction of the turntable 2 with respect to a direction perpendicular to the turntable 2. Therefore, the gas supplied from the process gas nozzle 33 is discharged in a direction opposite to the rotational direction of the turntable 2. More specifically, the gas is discharged toward a gap between the lower surface of the projection part 81b and the surface of the turntable 2. Accordingly, the process gas or the separation gas is prevented from flowing into the internal space S from the space 481, 482 below the ceiling surface 45 that is placed at the upstream side along the rotational direction of the turntable 2 with respect to the plasma generator 80. Also, as mentioned above, because the projection part 81b that is formed around the outer periphery of the lower surface of the frame member 81 is close to the surface of the turntable 2, the gas output from the process gas nozzle 33 can easily keep the pressure in the internal space S high. According to this feature, the process gas and the separation gas are prevented from flowing into the internal space S.

The Faraday shielding plate 82 is made of conductive material such as a metal, and the Faraday shielding plate 82 is grounded (although not shown in the figure). As illustrated in FIG. 8, a plurality of slits 82s are formed in the bottom part of the Faraday shielding plate 82. Each of the slits 82s extends in a direction almost perpendicular to a corresponding side of the antenna 85 having the almost octagonal plane shape.

Also, as illustrated in FIGS. 7 and 8, the Faraday shielding plate 82 includes holding parts 82a bent outwards at two upper end portions. The holding parts 82a are supported on the upper surface of the frame member 81 so that the Faraday shielding plate 82 is supported at a predetermined position in the frame member 81.

The insulating plate 83 is made of quartz glass, for example, and is slightly smaller than the bottom plane of the Faraday shielding plate 82. The insulating plate 83 is placed on the bottom plane of the Faraday shielding plate 82. The insulating plate 83 provides electrical insulation between the Faraday shielding plate 82 and the antenna 85, and on the other hand, the insulating plate 83 allows transmission of the high-frequency wave emitted from the antenna 85 downward.

The antenna 85 is formed by winding a copper pipe three times, for example, such that the planar shape becomes almost octagonal. Cold water can be circulated in the pipe. Accordingly, the antenna 85 is prevented from being heated by the high-frequency wave supplied to the antenna 85. Also, a standing part 85a is provided at both ends of the antenna 85, and a supporting part 85b is attached to the standing part 85a. The supporting part 85b keeps the antenna 85 at a predetermined position in the Faraday shielding plate 82. Also, a high-frequency power source 87 is connected to the supporting part 85b via a matching box 86. The high-frequency power source 87 can generate a high-frequency wave having a frequency of 13.56 MHz, for example.

According to the plasma generator having the above-mentioned structure, by supplying the high-frequency power to the antenna 85 from the high-frequency power source 87 via the matching box 86, the antenna 85 generates an electromagnetic field. The electric field component in the electromagnetic field is shielded by the Faraday shielding plate 82. Thus, the electric field component cannot propagate downward. On the other hand, the magnetic field component propagates into the internal space S through a plurality of slits 82s of the Faraday shielding plate 82. By the magnetic field component, plasma is generated from the gases such as Ar gas, $N_2$ gas and $H_2$ gas supplied to the internal space S at a predetermined flow rate ratio (mixture ratio) from the process gas nozzle 33. The generated plasma can decrease damage of a thin film deposited on the wafer W due to irradiation, and damage of each member in the vacuum chamber 1.

As illustrated in FIG. 1, the film deposition apparatus of the present embodiment is provided with a control part 100 that includes a computer for controlling operation of the whole apparatus. A memory of the control part 100 stores a program for causing the film deposition apparatus to perform an after-mentioned film deposition method. Such a program includes a group of steps for carrying out the film deposition method, and is installed into the control part 100 from a computer readable storage medium 102 such as a hard disk, a compact disc, a magneto optical disk, a memory card, a flexible disk, or the like, after being read to a memory unit 101.

Next, a description is given below of a method of depositing a silicon-containing film according to an embodiment of the present invention. In the film deposition method according to the embodiments of the present invention, a description is given below of an example of the film deposition method carried out by the above-mentioned film deposition apparatus described above with reference to FIGS. 1 through 8.

First Embodiment

Figures 9A, 9B:
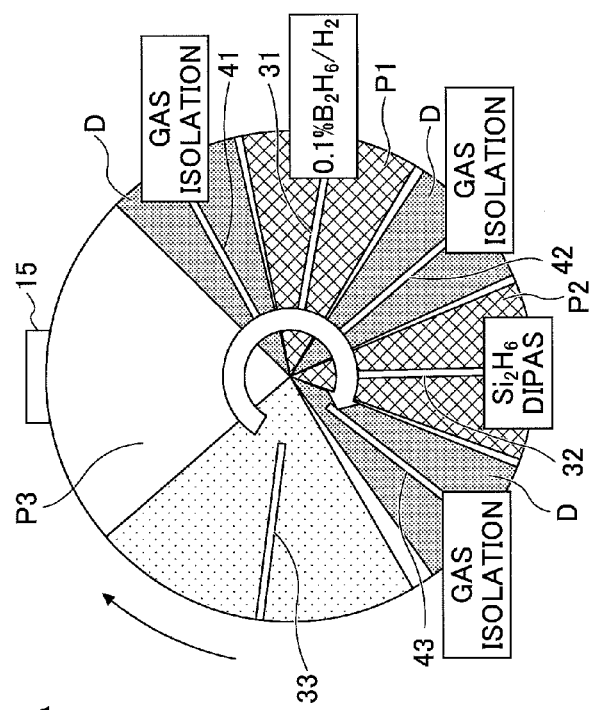
FIGS. 9A and 9B are diagrams for explaining a process flow of a method of depositing a silicon-containing film according to a first embodiment of the present invention.

FIGS. 9A and 9B are diagrams for explaining a process flow of a method of depositing a silicon-containing film according to a first embodiment of the present invention. FIG. 9A is a diagram illustrating an example of a planar arrangement of supplied gases of the film deposition apparatus for performing the method of depositing the silicon-containing film according to the first embodiment of the present invention. FIG. 9B is a timing chart illustrating an example of the method of depositing the silicon-containing film according to the first embodiment of the present invention. Here, in FIG. 9B, a conventional film deposition method in which a seed layer is not formed is illustrated as a comparative embodiment, and a timing chart of an upper row illustrates a conventional film deposition method. A timing chart in a lower row illustrates a process flow of the film deposition method according to the first embodiment of the present invention.

In the method of depositing the silicon-containing film according to the first embodiment, a description is given below of a method of depositing a silicon film containing boron (SiB film) on a wafer W. The term "silicon film containing boron (SiB film)" or "boron-containing silicon film (SiB film)" here is a silicon film slightly containing boron (B) used as a catalyst, and basically means a single film composed mostly of silicon.

To begin with, a description is given below of a substrate carry-in process, which corresponds to a preparatory operation of the method of depositing the silicon-containing film according to the first embodiment. Here, in the following description, the drawings that have been referred to in the above description is sometimes referred to again. The same numerals are used for components corresponding to the components that have been described, and the description is sometimes omitted.

First, the gate valve (not illustrated) in the drawings is opened, and a wafer W is transferred into the concave portion 24 of the turntable 2 through the transfer opening 15 (see FIGS. 2 and 3) from the outside by the transfer arm (not illustrated). The transfer is performed by causing the lift pins (not illustrated) to move up and down from the bottom side of the vacuum chamber 1 through the through holes 25 when the concave portion 24 stops at a position opposite to the transfer opening 15. Such a transfer of the wafer W is repeated while intermittently rotating the turntable 2, and the wafers W are placed in five of the concave portions 24 of the turntable 2.

Next, the gate valve is closed, and the vacuum chamber is evacuated by the vacuum pump 64 up to the lowest reachable pressure. After that, $N_2$ gas that is the separation gases is supplied from the separation gas nozzles 41, 42 and 43 at a predetermined flow rate, and $N_2$ gas is also supplied from the separation gas supplying pipe 51 and the purge gas supplying pipes 72, 73 at predetermined flow rates. Then, a pressure inside the vacuum chamber 1 is adjusted to a predetermined pressure by the pressure controller 65. Next, the wafers W on the turntable 2 are heated to a predetermined temperature in a range of 240 to 450 degrees C., for example, 250 degrees C. by the heater unit 7, while rotating the turntable 2 in a clockwise fashion when seen from above at a rotational speed of, for example, 240 revolutions per minute (rpm) at the maximum. The pressure in the vacuum chamber 1 can be set in a range of, for example, 0.5 to 9.5 Torr.

Subsequently, as illustrated in step S2 of FIG. 9B, a seed layer formation process is performed. More specifically, an aminosilane gas is supplied from the process gas nozzle 32 to the wafer W in the second process area P2 while rotating the turntable 2. When the wafer W is carried into the vacuum chamber 1, in general, a natural oxide film is formed on a surface of the wafer W. The natural oxide film is an oxide film generated on the surface of the wafer W without performing any process when the wafer W is placed and kept in the atmosphere. When the wafer W is a silicon wafer, a $SiO_2$ film is formed as the natural oxide film. When such a natural oxide film is formed on the surface of the wafer W, even if a silane-based gas for film deposition is supplied, it is difficult for the silane-based gas to directly adsorb on the surface of the wafer W. For example, even when the silane-based gas is supplied for about three hours, the silane-based gas does not adsorb on the surface of the wafer W in most cases, and only some silane-based gas adsorbs on the surface of the wafer W after spending six to eight hours. Such a low degree of adsorption makes it difficult to deposit a Si film on the surface of the wafer W in a practical manufacturing process because the productivity is so poor.

Therefore, in the method of depositing the silicon-containing film according to the first embodiment of the present invention, a seed layer is formed on the surface of the wafer W by supplying the amonosilane gas that can adsorb on the surface of the wafer W even if the natural oxide film is formed on the surface of the wafer W at the beginning. By forming the seed layer composed of the aminosilane gas on the surface of the wafer W, when the silane-based gas that is a source gas for film deposition is supplied, the silane-based gas can adsorb on the seed layer. This allows the subsequent film deposition process to be efficiently performed with high productivity.

The aminosilane gas supplied form the process gas nozzle 32 for seed layer formation is not limited to a specific type, a variety of aminoslane gases can be used depending on the intended purpose as long as the gas is an aminosilane gas. In the embodiment, a description is given below of an example of using (diisopropylamino) silane (DIPAS, $[SiH_3N(iPr)_2]$) as the aminoslane gas.

As illustrated in FIG. 9A, the second process gas nozzle 32 supplies (diisopropylamino) silane gas, and the other nozzles 31, 33, 41, 42 and 43 supply nothing due to the stop of the supply, or supply $N_2$ gas while rotating the turntable 2. A flow rate of (diisopropylamino) silane gas may be set in a range of, for example, 50 to 500 sccm.

The seed layer formation process just has to be performed until the seed layer is formed on the surface of the wafer W with preferable coverage properties. A period of time for the seed layer formation process may be set at a proper period of time depending on the intended purpose. For example, the period of time may be set in a range of 1 to 10 minutes, preferably in a range of 3 to 7 minutes, and further preferably in a range of 4 to 6 minutes, and most preferably at about 5 minutes.

After finishing the seed layer formation process, the process gas nozzle 32 stops supplying the aminoslane gas. As illustrated in step S3 of FIG. 9B, after finishing the seed layer formation process, a purge process is performed. In the purge process, any process gas is not supplied from the process gas nozzles 31 through 33, and $N_2$ gas is supplied from only the separation gas nozzle 41 through 43. When the process gas nozzles 31 through 33 can supply $N_2$ gas, the process gas nozzles 31 through 33 may supply $N_2$ gas. Also, although $N_2$ gas is supplied in the purge process in the embodiment, a noble gas such as Ar or He may be supplied instead of $N_2$ gas.

As illustrated in an upper row of FIG. 9B, conventional film deposition methods do not perform the seed layer formation process in step S2 and the purge process in step S3. In the conventional film deposition methods, after supplying the separation gas (purge gas) to the whole inside of the vacuum chamber 1 in step S1, a film deposition process is performed without performing the seed layer formation process of step S1 and the purge process of step S2. In this case, as discussed above, the adsorption of the silane-based gas on the surface of the wafer W becomes difficult, which is liable to decrease the productivity. In contrast, the film deposition method of the embodiment can create conditions in which the silane-based gas for film deposition is easy to adsorb on the surface of the wafer W by forming the seed layer on the surface of the wafer W.

The purge process in step S2 is performed to evacuate the aminosilane gas supplied in the seed layer formation process from the inside of the vacuum chamber 1 and to prepare the subsequent film deposition process.

Steps from S4 to S9 constitute a film deposition loop by ALD, and by repeating a cycle of steps S6 through S9, a silicon-containing film is deposited on the surface of the wafer W. Steps S6 through S9 are not processes performed in a step-by-step manner but continuous processes performed in series by rotating the turntable 2, and the whole cycle may be referred to as a film formation process or a film deposition process.

When performing the film deposition process, the separation gas nozzles 41 through 43 continuously supply the separation gas ($N_2$). The first process gas nozzle 31 supplies a boron-containing gas, and the second process gas nozzle 32 supplies the silane-based gas. The turntable 2 may be continuously rotated from step S1, or starts the rotation when the turntable 2 is stopped in the purge process of step S3.

As illustrated in FIG. 9A, the wafer W on the turntable 2 sequentially passes through the separation area D provided with the separation gas nozzle 41, the first process area P1 provided with the first process gas nozzle, the separation area D provided with the separation gas nozzle 42, the second process area P2 provided with the second process gas nozzle 32, and the separation area D provided with the separation gas nozzle 43 by the rotation of the turntable 2 in a clockwise direction. When starting the film deposition process, because positions of the wafers W are different from each other, the film deposition process does not necessarily starts from the separation area D provided with the separation gas nozzle 41. However, after starting the film deposition process from any position on the turntable 2, when the transfer opening 15 is (upper part in FIG. 9A) set at a starting point, the cycle of sequentially passing through the above-mentioned areas is repeated. A detailed description is given below of each of the processes performed when the wafer W passes through each of the areas.

First, in step S4 of FIG. 9B, a catalyst supply process is performed. In the catalyst supply process, the first process gas nozzle 31 in the first process area P1 supplies a boron-containing gas as a catalytic gas. The boron-containing gas has a decomposition accelerating action of cutting $H_2$ of the silane-based gas off from each other and a catalytic function of accelerating formation of a bond between Si atoms. When the wafer W passes through the first process area P1 by the rotation of the turntable 2, the boron-containing gas is supplied to the wafer W and adsorbs on the surface of the wafer W. A gas containing $BH_3$, $B_2H_6$, $B(CH_3)_3$, $BCl_3$ and the like is cited as an example of an available boron-containing gas. In the embodiment, a description is given below of an example of using a mixed gas of diborane ($B_2H_6$) and $H_2$ as the boron-containing gas. Here, when the boron-containing gas is the mixed gas of diborane ($B_2H_6$) and $H_{er}$ for example, a rate of diborane may be about 0.1%. When the first process gas nozzle 31 supplies $B_2H_6$ as the boron-containing gas, for example, $B_2H_6$ of 0.1% may be supplied at a flow rate in a range of 50 to 500 sccm. Moreover, a flow rate of the silane-based gas such as $SiH_6$ supplied from the second process gas nozzle 32 may be set in a range of, for example, 50 to 500 sccm.

In step S5, the wafer W on the turntable 2 moves to the lower part of the separation area D provided with the separation gas nozzle 42, and a gas separation process is performed in the separation area D. In the separation area D, the separation gas nozzle 42 supplies the separation gas, thereby purging the wafer W. Here, the gas separation process may be also referred to as a purge process.

In step S6, the wafer W on the turntable 2 moves to the lower part of the second process area P2 provided with the second process gas nozzle 32, and the second process gas nozzle 32 supplies the silane-based gas as the source gas to the surface of the wafer W. In other words, a source gas supply process for supplying the source gas to the wafer is performed. For example, a high-order silane-based gas such as $SiH_4$, $Si_2H_6$, or $Si_3H_8$ may be used as the silane-based gas. In the embodiment, a description is given below by citing an example of using $Si_2H_6$ as the silane-based gas. $Si_2H_6$ supplied to the wafer W releases $H_2$ gas therefrom, and bonds with boron adsorbed on the wafer W as an $SiH_2$ group while a bond between Si atoms is created, thereby depositing a Si film.

Figure 10C:
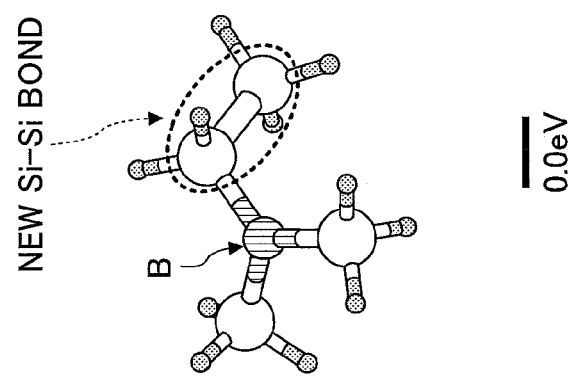
FIGS. 10A through 10C are diagrams for explaining catalysis of boron to a silane-based gas not containing chlorine.
Figure 10B:
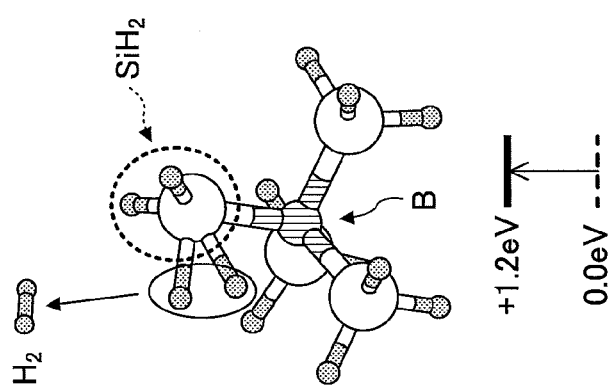
Figure 10A:
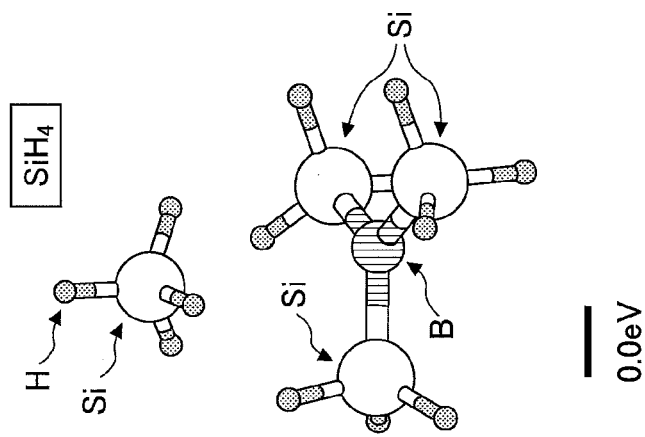

FIGS. 10A through 10C are diagrams for explaining a catalyst action of boron to the silane-based gas not containing chlorine. FIG. 10A is a diagram illustrating a state in which silane ($SiH_4$) is supplied when $B(SiH_2)_3$ is formed on the surface of the wafer W.

FIG. 10B is a diagram illustrating a state in which $H_2$ is released from silane and $B(SiH_2)_4$ is generated while supplied silane ($SiH_4$) reacts with boron (B) to bond with each other.

FIG. 10C is a diagram illustrating a state in which a new Si—Si bond is created. By causing such a reaction to occur, Si atoms bond with each other, and a Si film deposits. Such a reaction occurs at step S6 of FIG. 9B. As illustrated in FIGS. 10A through 10C, because such a reaction occurs in a state of low activation energy of about 1.2 eV, decreasing the temperature inside the vacuum chamber 1 becomes possible, and implementing a low temperature process becomes possible. In general, film deposition of an Si-containing film is performed at a temperature higher or equal to 400 degrees C., but performing film deposition at a temperature in a range of about 250 degrees C. to about 300 degrees C. becomes possible according to the film deposition method of the embodiment.

A description is given below of FIG. 9B again. In step S7, the wafer W moves to the lower part of the separation area D provided with the separation gas nozzle 43, and a gas separation process is performed. Because this process is the same as the gas separation process at step S5, the description thereof is omitted.

In step S8, the wafer W moves to the lower part of the third process area P3 provided with the process gas nozzle 33, and the gas separation process is continued. In the method of depositing the silicon-containing film of the first embodiment, plasma is not supplied. Hence, the process gas nozzle 33 does not function as a nozzle for supplying a process gas but as a separation gas nozzle for supplying the separation gas. In addition, when the process gas nozzle 33 is not needed, the process gas nozzle 33 does not have to be provided. Because the third process area P3 is adjacent to the separation area D including the separation gas nozzle 43 at the upstream side in the rotational direction of the turntable 2 and adjacent to the separation area D including the separation gas nozzle 41 at the downstream side in the rotational direction of the turntable 2, the separation gas is supplied from the separation areas D on both sides, and the third process area P3 is filled with the separation gas without supplying the separation gas from the process gas nozzle 33. Accordingly, the process gas nozzle 33 is not necessarily provided to supply the separation gas.

In step S9, the wafer W moves to the lower part of the separation area provided with the separation gas nozzle 41, and a gas separation process is performed by supplying the separation gas from the separation gas nozzle 41. Because this process is the same as the gas separation process of steps S5 and S7, the description thereof is omitted.

Thus, one cycle of the filmed deposition process is performed for each revolution of the turntable 2. The film deposition process constituted of steps S4 through S9 is repeated until the silicon-containing film is deposited on the wafer W up to a predetermined film thickness, and the supply of the first and second process gases from the first and second process gas nozzles 31 and 32 stops when reaching the predetermined film thickness. Subsequently, the supply of $N_2$ gas from the separation gas nozzles 41 through 43, the third process gas nozzle 33, the separation gas supplying pipe 51 and the purge gas supplying pipes 72 is stopped, and the rotation of the turntable 2 is stopped. After that, the wafer W is carried out of the vacuum chamber 1 by a procedure opposite to the procedure for carrying the wafer W into the vacuum chamber 1.

In this manner, according to the method of depositing the silicon-containing film of the first embodiment, the silicon-containing film can be deposited by the low temperature process with the high productivity without using plasma.

Working Example

Next, a description is given below of a working example of having performed the method of depositing the silicon-containing film of the first embodiment.

Figure 11:
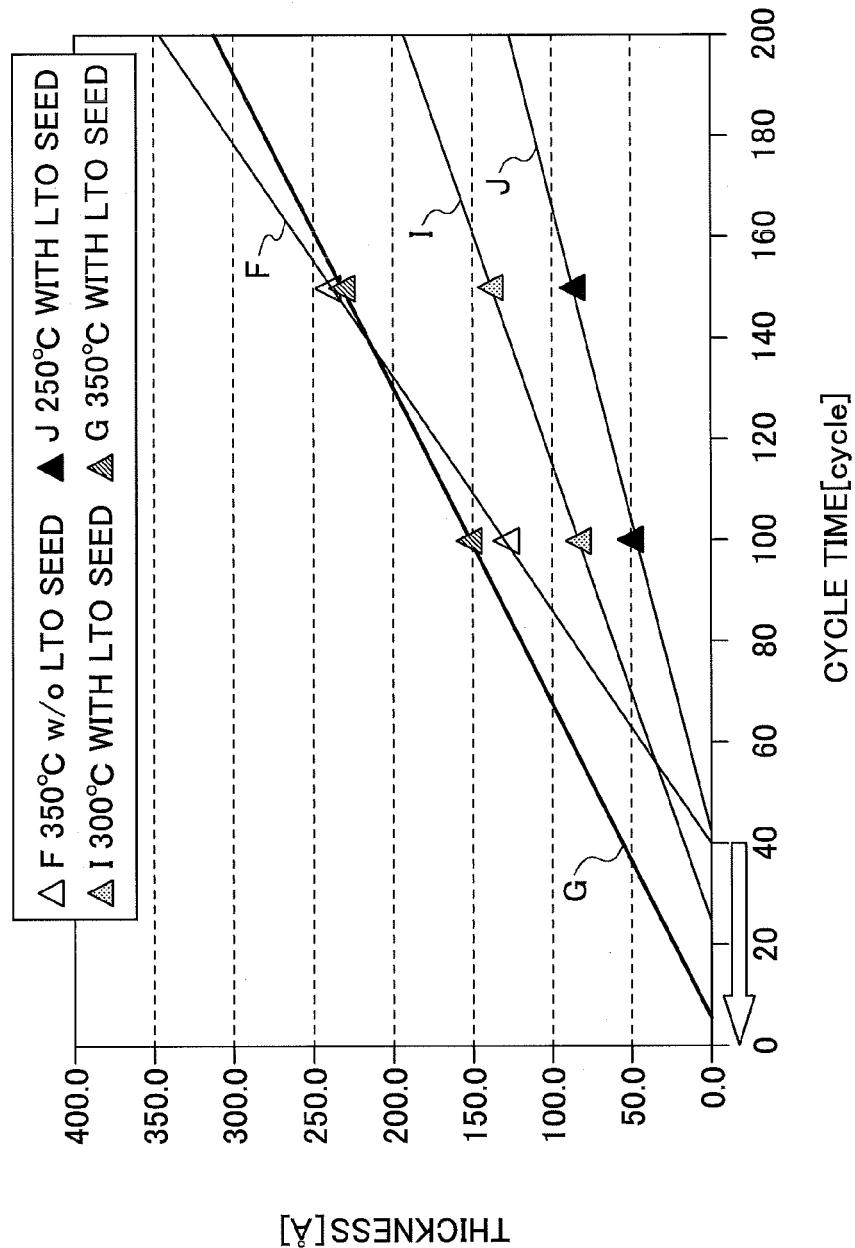
FIG. 11 is a graph showing a result of having performed a method of depositing a silicon-containing film according to a first practical example of the present invention.

FIG. 11 is a graph showing a result of having performed the method of depositing the silicon-containing film of a first practical example. In the first practical example, similarly to the first embodiment, the seed layer formation process was performed for five minutes by using (diisopropylamino) silane, and then the film deposition process was performed by using diborane ($B_2H_6$) as a boron-containing gas, and disilane as a source gas. The rotational speed of the turntable 2 was set at 2 rpm.

In the first practical example, the pressure inside the vacuum chamber 1 was set at 1 Torr, and the flow rate of (diisopropylamino) silane was set at 300 sccm. The flow rate of diborane was set at 250 sccm, and the flow rate of diborane was set at 200 sccm.

In FIG. 11, a horizontal axis shows a cycle time, and a vertical axis shows a film thickness. A line F shows a result of a film deposition method according to a comparative example 1 in which a temperature of a wafer was set at 350 degrees C. and the film deposition was performed without forming a seed layer. This corresponds to the film deposition method illustrated in the upper row of FIG. 9B. In this case, the film deposition was started from the $40^{th}$ cycle. This means that any film was not deposited at all, even though the film deposition process was performed until the $40^{th}$ cycle. This period of time from the time the film deposition process starts to the time the actual film deposition starts is called incubation time. In the comparative example 1, the incubation time of 40 cycles was generated.

On the other hand, a straight line G in FIG. 11 shows a result of a film deposition method according to a working example 1 in which a temperature of a wafer was set at 350 degrees C. and the film deposition process was performed after performing the seed layer formation process. According to the film deposition method of the working example 1, the incubation time was within about 3 to about 5 cycles, and a result of starting the actual film deposition after performing the film deposition process was obtained.

A straight line I shows a result of having performed a working example 2 in which the temperature of the wafer was set at 300 degrees C. and the seed layer formation process was performed. Although the temperature of the wafer was set lower by 50 degrees C. than the comparative example 1, the incubation time was about 13 to about 15 cycles. Although the temperature of the wafer was set low, a result of the incubation time shorter than the film deposition method of the comparative example 1 was obtained.

A straight line J shows a result of the film deposition method of a working example 3 in which the temperature of the wafer was set at 250 degrees C. and the seed layer formation process was performed as a further low temperature process. Although the temperature was set lower than the comparative example 1 by 100 degrees C., the incubation time was about 40 cycles that was almost the same as the incubation time of the comparative example 1.

In this manner, the film deposition method of the working examples 1 through 3 has indicated that the incubation time can be reduced and the low temperature process becomes possible by performing the seed layer formation process and the subsequent film deposition process.

Figure 12:
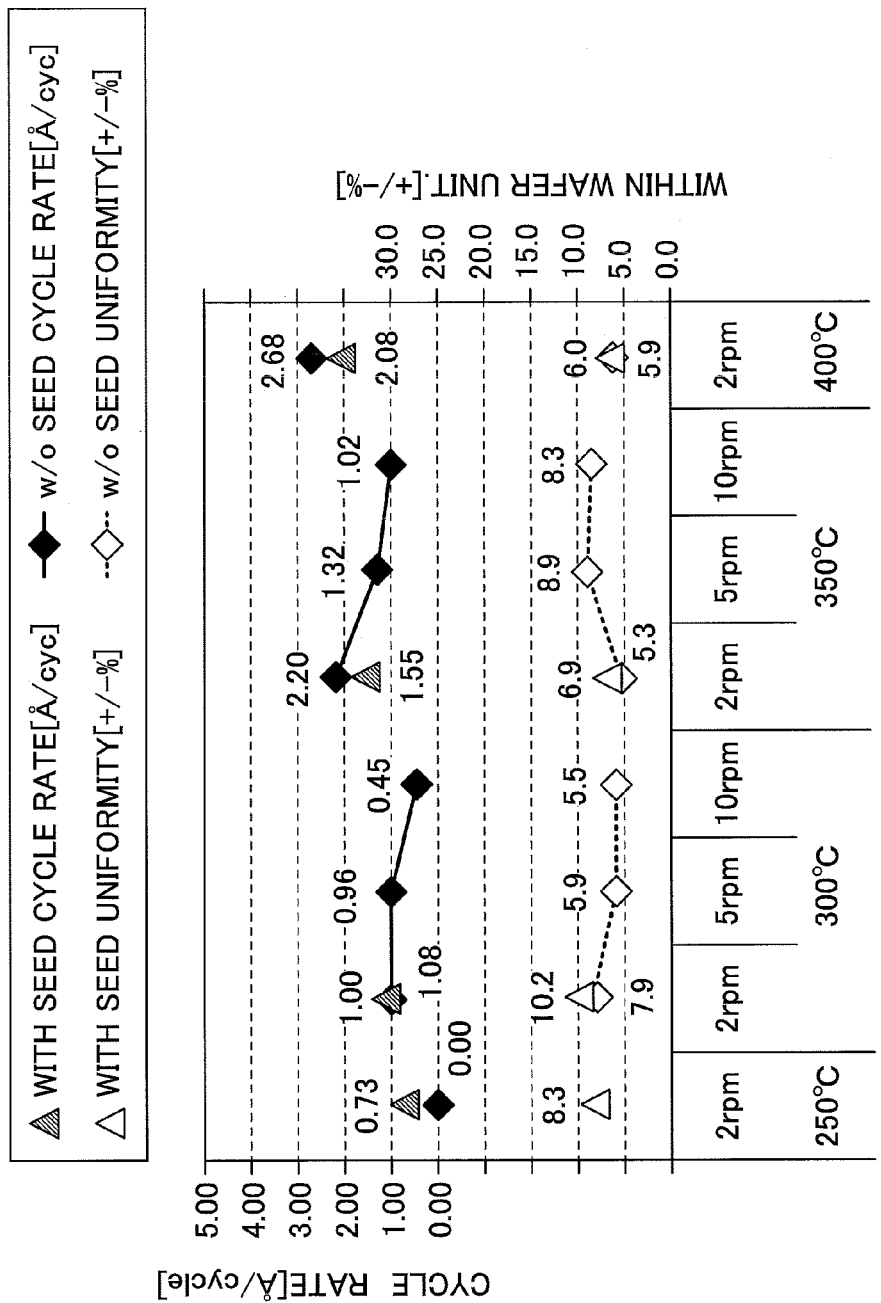
FIG. 12 is a graph showing a result of having performed a second practical example of the present invention.

FIG. 12 is a graph showing a result of a film deposition method according to a second practical example of the present invention. In the second practical example, comparison of a cycle rate of the film deposition and uniformity of the film across the surface of the wafer between the presence and absence of the seed layer formation process was performed at predetermined temperatures including the low temperature process in a range of 200 to 300 degrees C.

The other process conditions are the same as those of the first practical example. The pressure inside the vacuum chamber 1 was set at 1 Torr, and the flow rate of (diisopropylamino) silane was set at 300 sccm. The flow rate of diborane was set at 250 sccm, and the flow rate of disilane was set at 200 sccm.

In FIG. 12, a horizontal axis shows setting conditions of a temperature of the wafer and a rotational speed of the turntable 2, a vertical axis shows a cycle rate (Å/cycle) of the film deposition (film thickness) and uniformity of the film thickness across the surface of the wafer (+/−%). Moreover, in FIG. 12, triangular black and white plotted symbols show cycle rates (Å/cycle) of the film deposition and uniformity of the film deposition across the surface of the wafer (+/−%) of working examples 4 through 7 with the seed layer formation process when setting the temperature of the wafer at 250 degrees C., 300 degrees C., 350 degrees C. and 400 degrees C., respectively. The rotational speed of the turntable 2 was 2 rpm. Rhomboid black and while plotted symbols show cycle rates (Å/cycle) of the film deposition and uniformity of the film deposition across the surface of the wafer (+/−%) of comparative examples 2 through 5 without the seed layer formation process when setting the temperature of the wafer at 250 degrees C., 300 degrees C., 350 degrees C. and 400 degrees C., respectively. With respect to the rotational speed of the turntable 2, three samples of 2 rpm, 5 rpm and 10 rpm were obtained under conditions of 300 degrees C. of the comparative example 3 and 350 degrees C. of the comparative example 4 while only one sample of 2 rpm was obtained under conditions of 250 degrees C. of the comparative example 2 and 400 degrees C. of the comparative example 5.

When the cycle rate of the film deposition method of the working example 4 in which the temperature of the wafer W was set at 250 degrees C. is compared with the cycle rate of the film deposition method of the comparative example 2 in which the temperature of the wafer was also set at 250 degrees C., the working example 4 was 0.73 (Å/cycle) while the comparative example was 0.0 (Å/cycle). This means that the film deposition method of the working example 4 could deposit a film of 0.73 (Å/cycle) while the film deposition method of the comparative example 2 could not deposit a film at all even though the film deposition process was performed for more than three hours and have no other choice other than expressing 0.0 (Å/cycle). Thus, by performing the film deposition process after forming a seed layer, the incubation time can be suppressed at the start of the film deposition process, thereby rapidly starting the substantial film deposition without generating useless standby time.

On the other hand, when comparing the working example 5 with the comparative example 3 in which the temperature of the wafer was set at 300 degrees C., the working example 6 with the comparative example 4 in which the temperature of the wafer was set at 350 degrees C., and the working example 7 with the comparative example 5 in which the temperature of the wafer was set at 400 degrees C., respectively, the cycle rate and the uniformity across the surface of the wafer W indicate substantially the same values without respect to the presence or absence of the seed layer. The result indicates that the seed layer formation is effective at promptly performing the film deposition at the start of the film deposition process but has little effect on the cycle rate and the uniformity across the surface of the wafer W after once starting the film deposition. In other words, once the film deposition starts, the presence or absence of the seed layer does not influence on the subsequent film deposition because the underlying film (seed layer) becomes the same as the film.

Figure 13A:
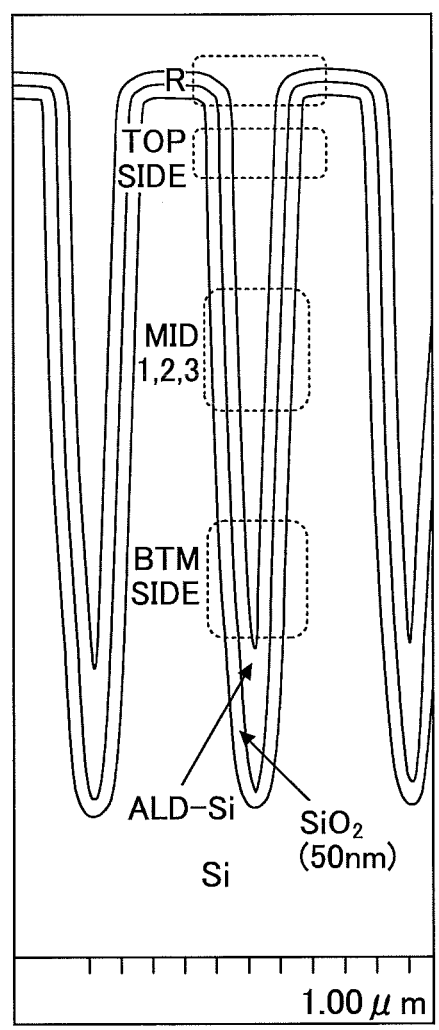

FIGS. 13A and 13B are diagrams showing the result of the film deposition method of a third practical example. In the film deposition of the third example, when a recessed pattern of a trench was formed in a surface of a wafer, coverage properties of the silicon containing film deposited in a trench were measured.

The process conditions were the same as the first practical example. The pressure inside the vacuum chamber 1 was set at 1 Torr, and the flow rate of (diisopropylamino) silane was set at 300 sccm. The flow rate of diborane was set at 300 sccm, and the flow rate of disilane was set at 200 sccm.

FIG. 13A is a diagram for explaining measurement locations in the trench. The trench of the wafer W used in the third practical example has the aspect ratio of 10, the width of 0.23 micrometers, and the depth of 2.3 micrometers. As illustrated in FIG. 13A, film thicknesses were measured at six locations of the trench including an R including the surface, a TOP SIDE near the surface, a MID 1, a MID 2 and a MID 3 around the middle of the trench, and a BOTTOM SIDE. The film thickness of the TOP was made 100%, and how many percentages of the film thickness was deposited at each location was measured.

FIG. 13B is a graph showing measurement results of the coverage properties of the film deposition method of the third practical example with those of comparative examples. FIG. 13B shows the results of a working example 8 in which the temperature of the wafer W was set at 250 degrees C. and the seed layer formation process was performed for five minutes, and a working example 9 in which the temperature of the wafer W was set at 350 degrees C. and the seed layer formation process was performed. Moreover, FIG. 13B shows the results of a comparative example 6 in which the temperature of the wafer was set at 350 degrees C. and the seed layer formation process was not performed, a comparative example 7 in which the temperature of the wafer was set at 400 degrees C. and the seed layer formation process was not performed, and a comparative example 8 in which the temperature of the wafer W was set at 450 degrees C. and the seed layer formation process was not performed. The rotational speed of the turntable 2 was all set at 2 rpm.

Comparing the working example 9 with the comparative example 6 in which the temperature of the wafer W was set at 350 degrees C., there is no great difference between the working example 9 and the comparative example 6 in the coverage properties. Similarly, there is no great difference between the working example 9 and the comparative example 7 when setting the temperature of the wafer W at 400 degrees C., and between the working example 9 and the comparative example 8 when setting the temperature of the wafer W at 450 degrees C. All of the working example 9 and the comparative examples 6 through 8 had the coverage properties of about 80% on average.

In contrast, the working example 8 when setting the temperature of the wafer W at 250 degrees C. indicates substantially improved coverage properties. More specifically, the film thicknesses were close to 100% at most locations, and the coverage properties were about 90%. This indicates that the film deposition with high coverage properties can be performed when performing the film deposition process after forming the seed layer under conditions of a low temperature of about 250 degrees C. The low temperature process prevents the heating energy from spending excessively and shortens a heating period of time, which is more advantageous than the high temperature process in terms of cost and time. Furthermore, a warp of the wafer W that occurs the wafer W is carried into the vacuum chamber can be reduced. In addition, handling a variety of devices and units inside and outside the vacuum chamber 1 can be made easier, which has various advantages. It can be said that the practical examples imply a possibility of an expansion of a use of the method of depositing the silicon-containing film according to the embodiment.

Figure 14:
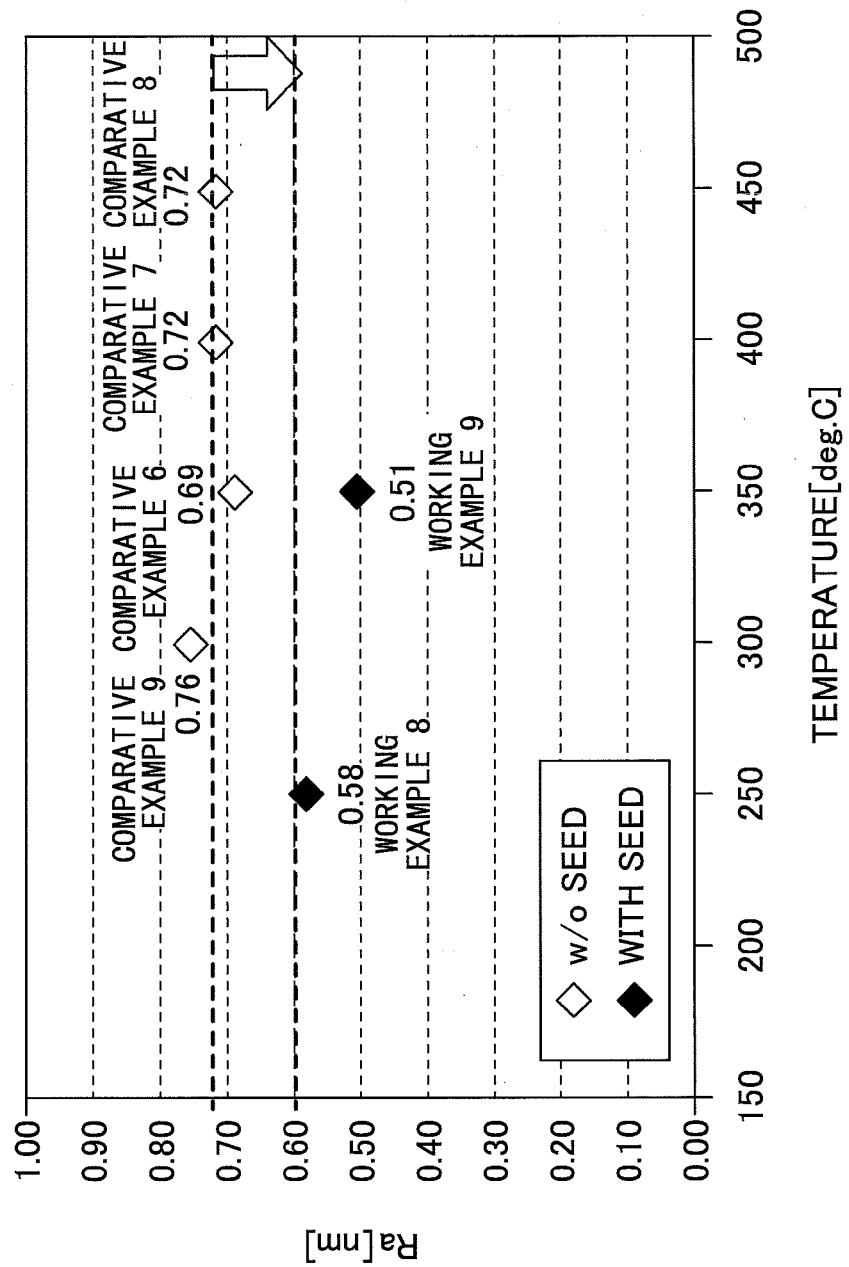
FIG. 14 is a graph showing a measurement result of surface roughness of a film obtained by performing a method of depositing a silicon-containing film according to the third practical example of the present invention.

FIG. 14 is a graph showing a measurement result of surface roughness of the film deposited by performing the method of depositing the silicon-containing film of the third embodiment of the present invention. In FIG. 14, a horizontal axis shows a temperature (degrees C.), and a vertical axis shows the surface roughness Ra (nanometers). The film deposition conditions are the same as the conditions shown in FIGS. 13A and 13B, and the results show the measurement results of the surface roughness Ra of the film deposited in FIGS. 13A and 13B.

As shown in FIG. 14, there are black rhomboid symbols showing the working examples 8 and 9 in which the film deposition was performed after forming the seed layer and white rhomboid symbols showing the comparative examples 6 through 9 in which the film deposition was performed without forming the seed layer. In FIG. 14, a measurement result of the comparative example 9 without the seed layer and setting the temperature of the wafer W at 300 degrees C., is added.

As shown in FIG. 14, while the surface roughness Ra was about 0.7 nanometers in the comparative examples 6 through 9, the surface roughness Ra reduced to a level of 0.5 to 0.6 nanometers, as the working example 8 indicated 0.58 nanometers and the working example 9 indicated 0.51 nanometers. Hence, the results have indicated that performing the film deposition after forming the seed layer has an effect of reducing the surface roughness of the film.

Thus, the results of the first to third practical examples have indicated that the method of depositing the silicon-containing film according to the first embodiment can implement a low temperature process with high coverage properties while reducing the incubation time at the start of a film deposition process and further reducing surface roughness of a film.

Moreover, in addition to the results of the first through third practical examples, it was confirmed that the film deposition can be performed at a pressure of 4 Torr that is higher than the practical examples and at a temperature of 200 degrees C. This indicates that the film deposition can be implemented at a lower temperature by increasing a pressure inside the vacuum chamber 1. Accordingly, in the method of depositing the silicon-containing film according to the embodiment of the present invention, the film deposition of the silicon-containing film is possible in a range of 200 to 350 degrees C.

Second Embodiment

Figures 15A, 15B:
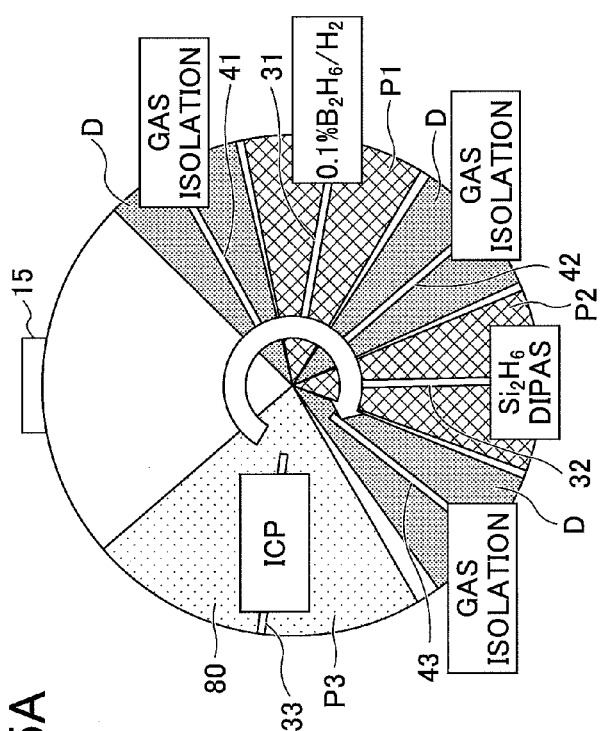
FIGS. 15A and 15B are diagrams for explaining an example of a method of depositing a silicon-containing film according to a second embodiment of the present invention.

FIGS. 15A and 15B are diagrams for explaining an example of a method of depositing a silicon-containing film according to a second embodiment of the present invention. In the method of depositing the silicon-containing film according to the second embodiment of the present invention, a description is given below of a method of depositing a silicon nitride (SiN) film, different from a monomolecular film of silicon. Here, because the silicon nitride film contains boron (B) although a tiny amount of boron, the method of depositing the silicon nitride (SiN) film is a method of depositing a SiBN film in a precise sense.

FIG. 15A is a diagram illustrating an example of a film deposition apparatus to perform the method of depositing the silicon-containing film according to the second embodiment. As illustrated in FIG. 15A, the first process area P1 including the first process gas nozzle 31 and the second process area P2 including the process gas nozzle 32 are provided apart from each other in the rotational direction of the turntable 2 as well as the film deposition apparatus to perform the method of depositing the silicon-containing film according to the first embodiment illustrated in FIG. 9A. Furthermore, the separation area including the separation gas nozzle 41 located upstream of the process area P1, the separation area D including the separation gas nozzle 42 located between the first process area P1 and the second process area P2, and the separation area D including the separation gas nozzle 43 located downstream of the second process area P2, are provided similarly to the film deposition apparatus of FIG. 9A. The film deposition apparatus in FIG. 15A differs from the film deposition apparatus in FIG. 9A in that a plasma generator 80 is further provided in the third process area P3 located downstream of the separation area D including the separation gas nozzle 43. In the method of depositing the silicon-containing film according to the second embodiment, after depositing a SiB film in the first process area P1 and the second process area P2 by way of the separation areas D, nitriding radicals are supplied to the wafer W at the third process area P3 by using the plasma generator 80, thereby depositing the SiBN film on the wafer.

FIG. 15B is a timing chart illustrating an example of the method of depositing the silicon-containing film according to the second embodiment. In the timing chart illustrated in FIG. 15B, because steps S1 through S7 and transfer operation of the wafer W are the same as the description given with reference to FIG. 9B, the description is omitted. A description is given below of points different from the method of depositing the silicon-containing film according to the first embodiment with reference to FIG. 9B.

To begin with, after a plurality of wafers W is carried into the vacuum chamber 1 and placed on the turntable 2, the vacuum chamber 1 is evacuated, and a temperature of the heater unit 7 is adjusted. After that, in steps S1 and S2 of FIG. 15B, the same processes as described with reference to FIG. 9B are performed. In other words, from the purge process to the seed layer formation process, the processes are performed in the same procedure as the first embodiment. The pressure inside the vacuum chamber 1 can be set at, for example, 0.5 to 9.5 Torr. Moreover, a flow rate of (diisopropylamino) silane may be set, for example, in a range of 50 to 500 sccm.

Then, after performing the purge process at step S3, the process gas nozzles 31 and 32 discharge a boron-containing gas (mixed gas of $B_2H_6$ and $H_2$) and a silane-based gas ($Si_2H_6$), respectively, while the process gas nozzle 33 supplies a mixed gas of Ar gas, $N_2$ gas and $H_2$ gas that are mixed at a predetermined flow ratio to the internal space S and the high frequency power source 87 supplies high frequency power of, for example, 700 W to the antenna 85 of the plasma generator 80. Accordingly, plasma is generated in the internal space S. The plasma includes active nitrogen species such as nitrogen ion and nitrogen radical, and active hydrogen species such as hydrogen ion and hydrogen radical. Here, $NH_3$ plasma may be generated by using $NH_3$ gas instead of $N_2$ gas in the mixed gas for plasma generation.

When $B_2H_6$ is supplied from the first process gas nozzle 31 as the boron-containing gas, for example, $B_2H_6$ of 0.1% may be supplied at a flow rate of 50 to 500 sccm. The flow rate of the silane-based gas such as $Si_2H_6$ supplied from the second process gas nozzle 32 may be set at, for example, 50 to 500 sccm. Moreover, the high frequency power supplied from the high frequency poser source 87 may be set, for example, in a rage of 1500 to 5000 W. Furthermore, the flow rate of $N_2$ gas may be set, for example, in a range of 0.5 to 10 slm.

Next, the film deposition process of an ALD loop constituted of steps S4 through S9 is performed as one cycle. While the turntable 2 rotates one revolution, silicon nitride is deposited on the wafer W in a way explained as follows. That is, first, when the wafer W passes through the first process area P1 under the process gas nozzle 31, the boron-containing gas that functions as a catalyst adsorbs on the surface of the wafer W. Next, when the wafer W passes through the second process area P2 under the process gas nozzle 32, $Si_2H_6$ gas supplied from the second process gas nozzle 32 bonds with boron (B) while $H_2$ is generated and released. Then, a bond between Si atoms is created, and a one atomic layer (or a few or several atomic layers) of a single element film of silicon containing a little boron is deposited (steps S4 through S6).

Then, when the wafer passes through an area under the plasma generator 80 provided at the process area P3 after passing through the separation area D (step S7), the boron-containing silicon layer (SiB) on the wafer W is exposed to the active nitrogen species and the active hydrogen species. Here, N radicals react with the silicon layer containing boron, and a boron-containing silicon nitride film is generated (step S8).

After that, the wafer W passes through the separation area including the separation gas nozzle 41 (step S9), and the ALD loop starts from step S4 again. The film deposition process of steps S4 through S9 is repeated until reaching a predetermined film thickness.

After rotating the turntable 2 spredetermined number of times such that a silicon nitride film having a desired film thickness is deposited, the film deposition method finishes by stopping supplying the boron-containing gas, the silane-based gas, and the mixed gas of Ar gas, $N_2$ gas and $H_2$ gas. Subsequently, the supply of $N_2$ gas from the separation gas nozzles 41 through 43, the separation gas supplying pipe 51, and the purge gas supplying pipes 72 is stopped, and rotation of the turntable 2 is stopped. After that, the wafers W are taken out from the vacuum chamber 1 by a procedure opposite to the procedure for carrying the wafer W into the vacuum chamber 1.

Thus, according to the method of depositing the silicon-containing film of the second embodiment, a silicon nitride film can be deposited while enhancing productivity by forming a seed layer to suppress incubation time. Here, even in the method of depositing the silicon-containing film of the second embodiment, the low temperature process can be implemented. When depositing the silicon nitride film, a silicon film made of a single element can be deposited in an amorphous state by the low temperature process, which has an advantage of being able to readily perform nitriding. Including this regard, a detailed description is given below of the method of depositing the silicon-containing film according to the second embodiment by using a specific practical example.

Practical Example

Figure 16:
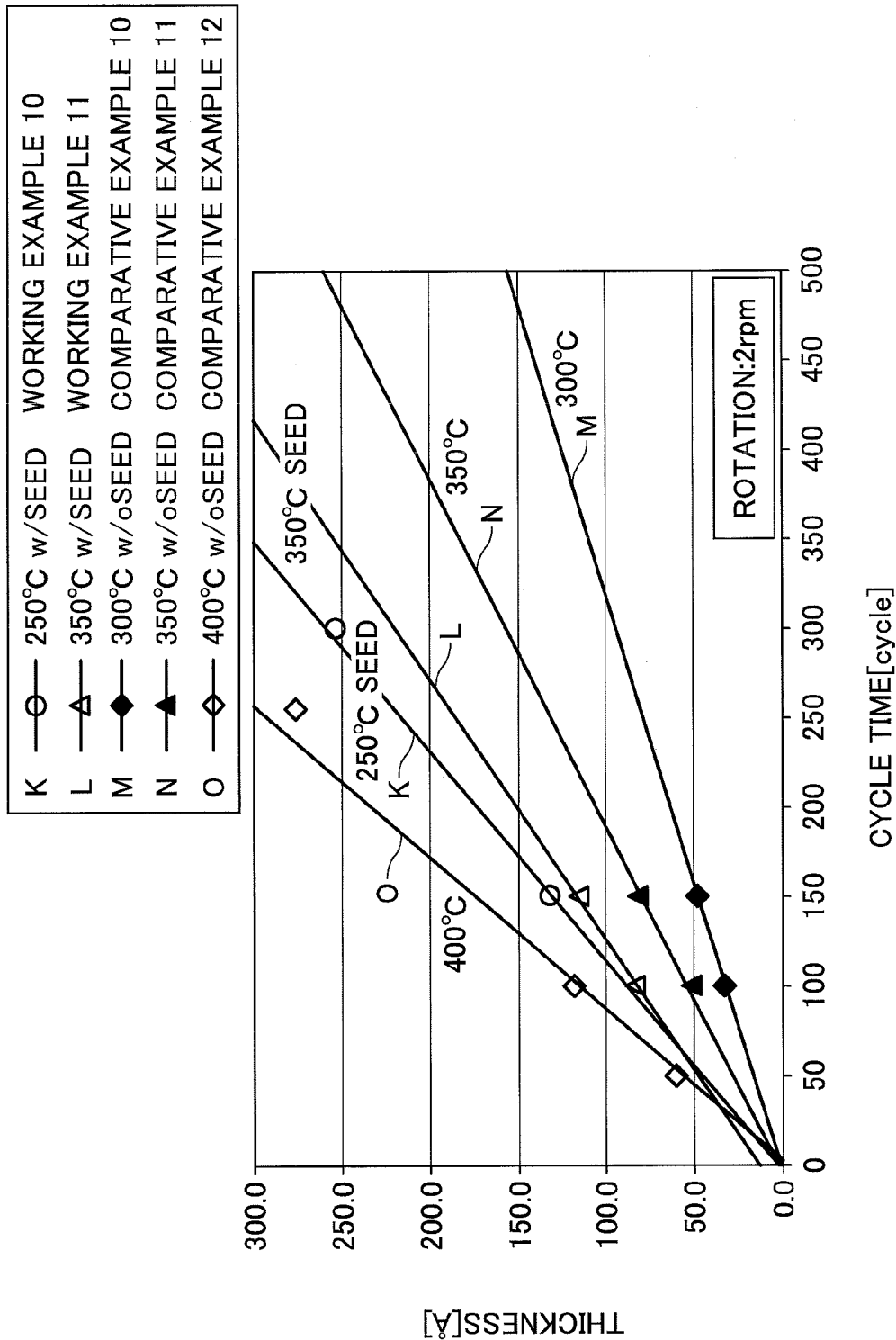
FIG. 16 is a graph showing a result of having performed a method of depositing a silicon-containing film according to a fourth practical example of the present invention.

FIG. 16 is a diagram showing a result of having performed a method of depositing a silicon-containing film of a fourth practical example of the present invention. FIG. 16 shows a result indicating a relationship between cycle time and a film thickness. In FIG. 16, a film deposition rate of each example is shown, which means that the film deposition rate and the productivity is higher as a slope is greater. The rotational speed of the turntable 2 was 2 rpm.

In the fourth practical example, the pressure inside the vacuum chamber 1 was set at 1 Torr, and the flow rate of (diisopropylamino) silane was set at 300 sccm. The flow rate of diborane was set at 250 sccm, and the flow rate of disilane was set at 200 sccm. The high frequency power of the high frequency power source 87 was set at 3000 W. The flow rate of $N_2$ gas of the mixed gas for plasma generation was set at 4 slm.

In FIG. 16, a straight line K is a result of a working example 10 in which a temperature of the wafer W was set at 250 degrees C. and a seed layer formation process was performed, and a straight line L is a result of a working example 11 in which the temperature of the wafer W was set at 350 degrees C. and the seed layer formation process was performed. Also, a straight line M is a result of a comparative example 10 in which the temperature of the wafer W was set at 300 degrees C. and the seed layer formation process was not performed, and a straight line N is a result of a comparative example 11 in which the temperature of the wafer W was set at 350 degrees C. and the seed layer formation process was not performed. A straight line O is a result of a comparative example 12 in which the temperature of the wafer W was set at 400 degrees C. and the seed layer formation process was not performed.

As illustrated in FIG. 16, comparing the result of the working example 10 setting the temperature of the wafer W at 250 degrees C. with the working example 10 setting the temperature of the wafer W set at 350 degrees C., which is higher than the temperature of the working example 10, the film deposition rate of the working example 10 is higher than the film deposition rate of the working example 11. Moreover, comparing the working examples 10 and 11 with the comparative examples 10 through 12, the film deposition rate of the comparative example 12 setting the temperature of the wafer W at 400 degrees C., which was the highest of the examples, was greater than the film deposition rate of the working example 10, but the deposition rates of the comparative examples 10 and 11 setting the temperature of the wafer W at 300 degrees C. and 350 degrees C., respectively, which are lower than 400 degrees C., were lower than the deposition rates of both of the working examples 10 and 11.

Hence, in the film deposition of the SiN film, when forming the seed layer, the film deposition rate is faster at a lower temperature. In other words, the fourth practical example has indicated that the low temperature process is effective in terms of increasing the film deposition rate in the film deposition of the SiN film. Moreover, the fourth practical example has indicated that the film deposition rate increases as the process temperature increases when the seed layer is not formed.

Figure 17:
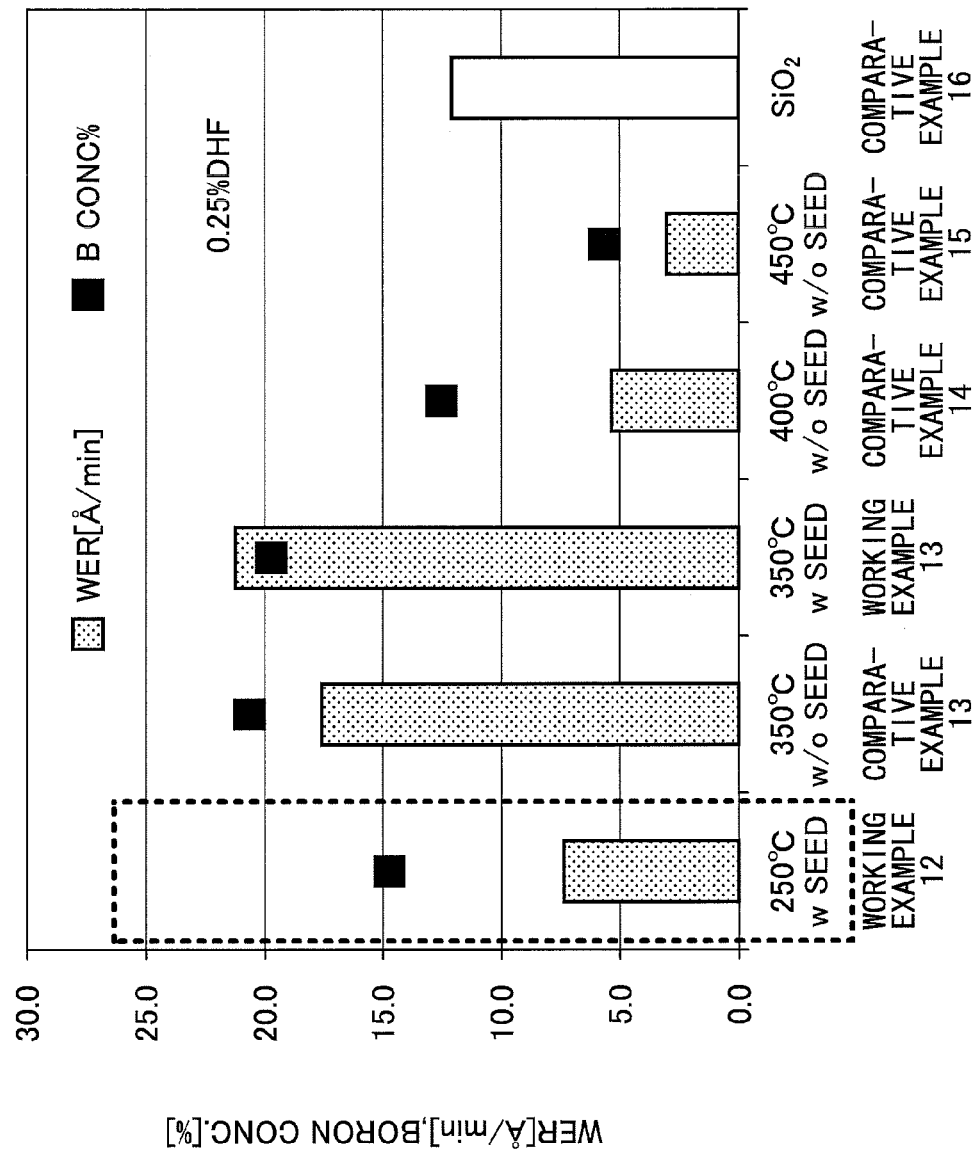
FIG. 17 is a graph showing a result of etching tolerance of a film obtained by performing a method of depositing a silicon-containing film according to a fifth practical example of the present invention.

FIG. 17 is a result of having examined an etching tolerance of a film deposited by a method of depositing a silicon-containing film of a fifth practical example of the present invention. In the fifth practical example, to examine a density of a film, an etching tolerance of each film was examined by etching the film with hydrofluoric acid. As illustrated in FIG. 17, experimental objects were a working example 12 in which a temperature of the wafer W was set at 250 degrees C. and a seed layer formation process was performed, a working example 13 in which the temperature of the wafer W was set at 300 degrees C. and the seed layer formation process was performed, a comparative example 13 in which the temperature of the wafer W was set at 350 degrees C. and the seed layer formation process was not performed, a comparative example 14 in which the temperature of the wafer W was set at 400 degrees C. and the seed layer formation process was not performed, a comparative example 15 in which the temperature of the wafer W was set at 450 degrees C. and the seed layer formation process was not performed, and a comparative example 16 in which a $SiO_2$ film was deposited and the seed layer was not performed.

In the fifth practical example, the other process conditions were the same as the process conditions of the fourth practical example. The pressure in the vacuum chamber 1 was set at 1 Torr, and the flow rate of (diisopropylamino) silane was set at 300 sccm. The flow rate of diborane was set at 250 sccm, and the flow rate of disolane was set at 200 sccm. The high frequency power of the high frequency power source 87 was set at 3000 W. The flow rate of $N_2$ gas was set at 4 slm.

As illustrated in FIG. 17, an amount of etching when a seed layer was formed and a temperature of the wafer W was set at 250 degrees C., which was the lowest of the examples, and an amount of etching when a seed layer was not formed and a temperature of the wafer W was set at 450 degrees C., which was the highest of the examples, were low, which means that dense films were obtained in two of the examples.

In this manner, the result has indicated that the low temperature process can make both of the film deposition rate and the film quality higher than the high temperature process when suppressing the incubation time by forming the seed layer.

The reason is considered to be due to a boarder existing at about 300 degrees C. that changes a crystal structure of silicon. More specifically, it is considered that a temperature at which silicon crystalizes is about 300 degrees C. and that a process can be performed by using silicon in a state of amorphous when the process is performed at a temperature of 250 degrees C. It is also considered that silicon in the amorphous state has an enough space to allow nitrogen to go thereinto when reacting nitrogen with a silicon film and that the silicon film maintains a state easy to react with nitrogen.

On the other hand, it is considered that a film deposition rate and the film quality becomes better as the temperature becomes higher according to the general principles when silicon crystalizes at a temperature of 300 degrees C. or higher.

Accordingly, the method of depositing the silicon-containing film according to the second embodiment has many possibilities of developing a variety of processes using amorphous silicon in the future.

Figure 18:
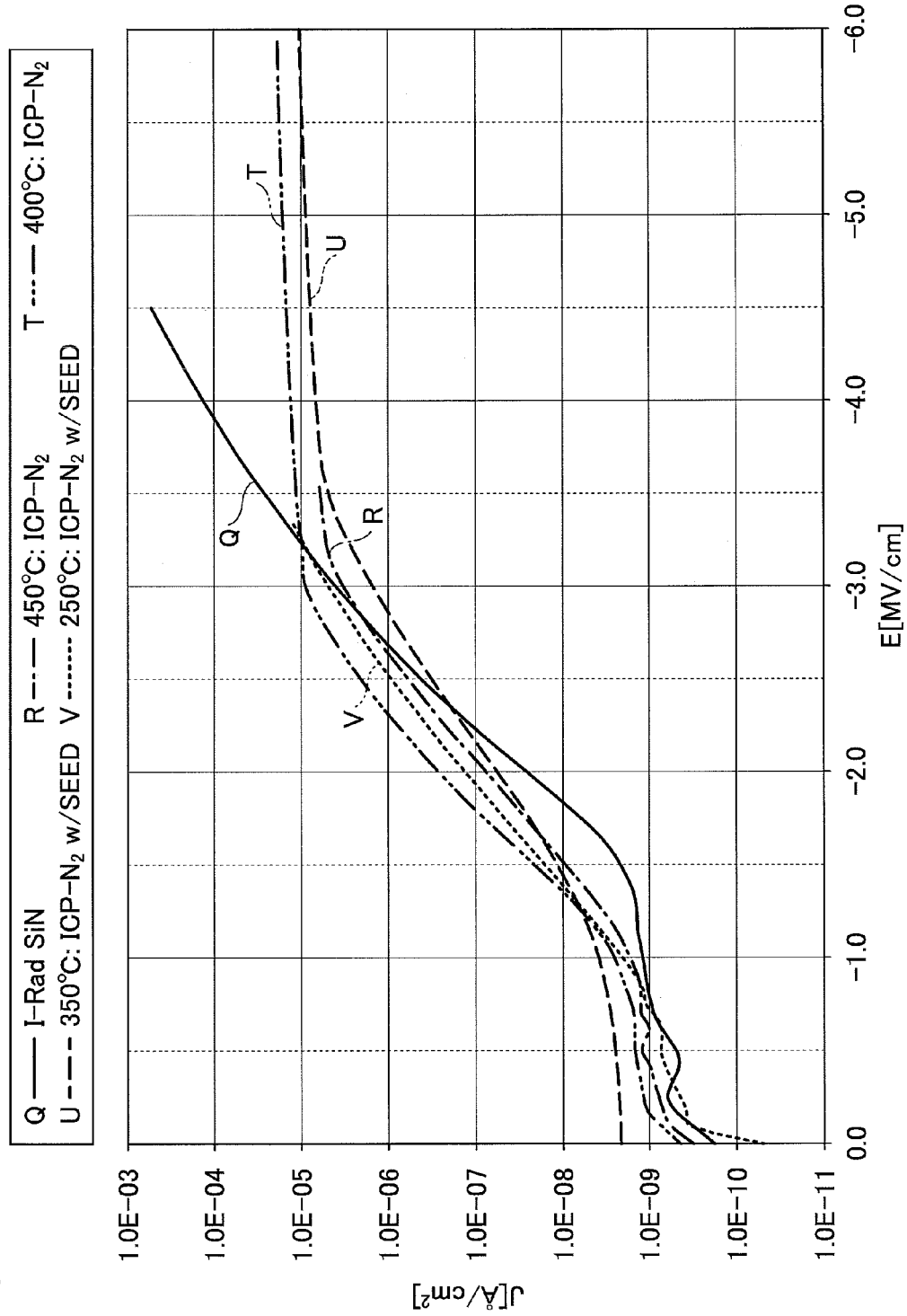
FIG. 18 is a graph showing a result of insulation properties of a film obtained by performing a method of depositing a silicon-containing film according to a sixth practical example of the present invention.

FIG. 18 is a graph showing a result of having examined insulating properties of films deposited by a method of depositing a silicon-containing film of a sixth practical example of the present invention. In the sixth practical example, after the film deposition of each of the working examples and comparative examples, a quantity of generation of a leakage current was examined by applying a electric field to each of the films. In FIG. 18, a property Q is shown as a reference property. Compared to the property Q, FIG. 18 shows a comparative example 17 indicating a property R in which a temperature of a wafer W was set at 450 degrees C. and a seed layer was not formed, a comparative example 18 indicating a property T in which the temperature of the wafer W was set at 400 degrees C. and the seed layer was not formed, a working example 14 indicating a property U in which the temperature of the wafer W was set at 350 degrees C. and the seed layer was formed, and a working example 15 indicating a property V in which the temperature of the wafer W was set at 250 degrees C. and the seed layer was formed.

In the sixth practical example, the other process conditions were the same as the fourth practical example. The pressure in the vacuum chamber 1 was set at 1 Torr, and the flow rate of (diisopropylamino)silane was set at 300 sccm. The flow rate of diborane was set at 250 sccm, and the flow rate of disolane was set at 200 sccm. The high frequency power of the high frequency power source 87 was set at 3000 W. The flow rate of $N_2$ gas was set at 4 slm.

As illustrated in FIG. 18, all of the leakage currents of the working example 14 (property U), the working example 15 (property V), the comparative example 17 (property R) and the comparative example (property T) indicate a similar property to the reference property Q. This result has indicated that the films deposited by the film deposition method of the sixth practical example have electrical properties (insulating properties) that have no problem.

Figure 19A:
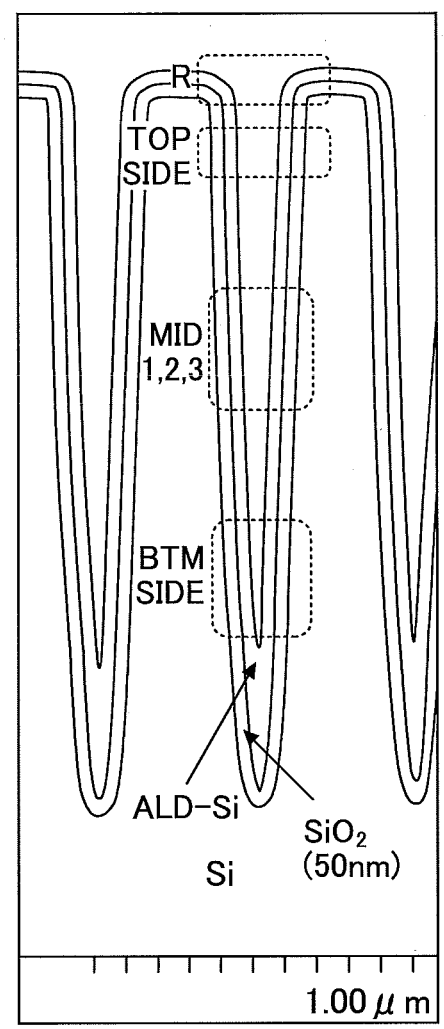
FIGS. 19A and 19B are diagrams showing a result of coverage properties of a film obtained by performing a method of depositing a silicon-containing film according to a seventh practical example of the present invention.
Figure 19B:
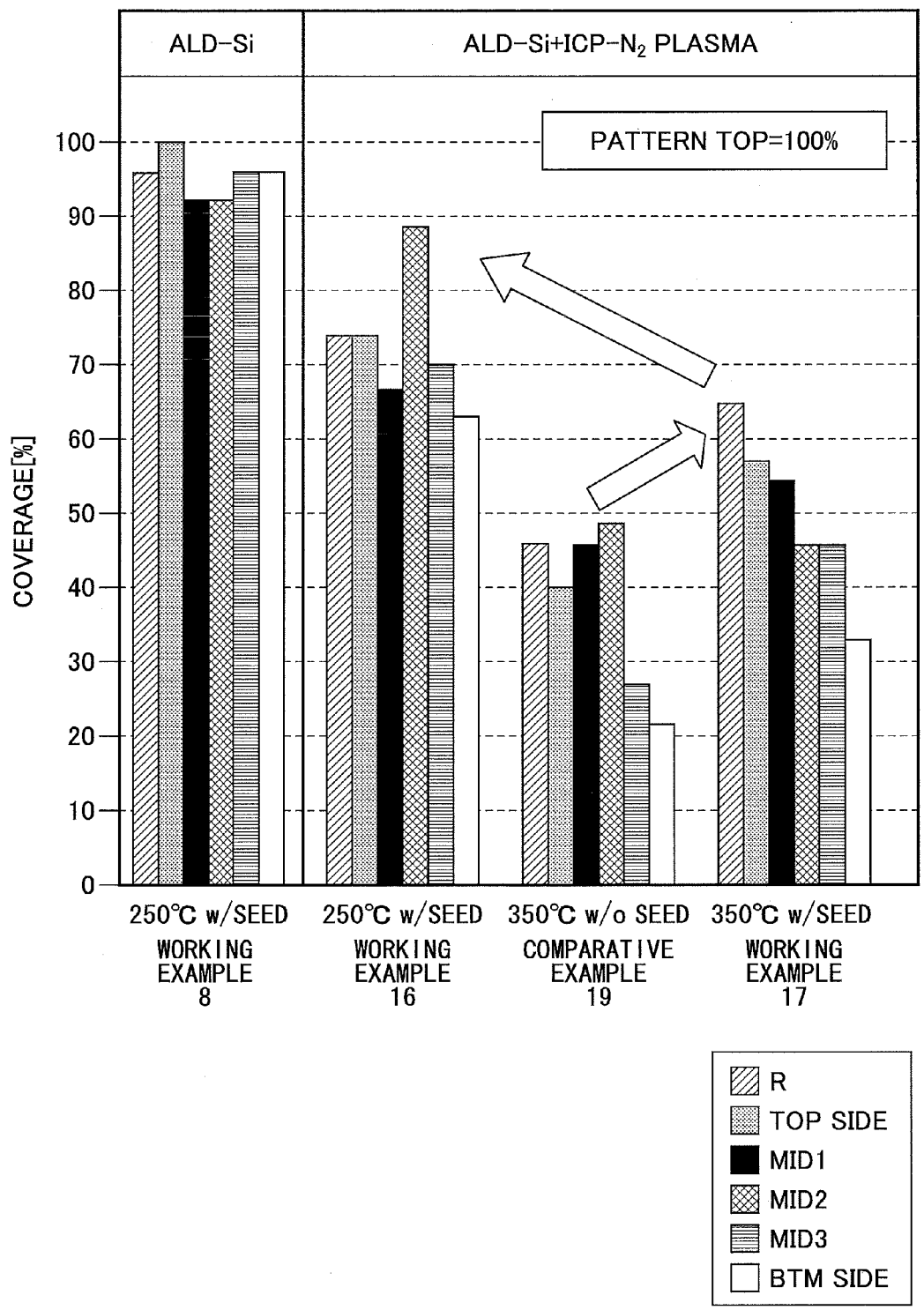

FIGS. 19A and 19B are diagrams showing a result of having examined coverage properties of films deposited by a method of depositing a silicon-containing film of a seventh practical example of the present invention. Even in the seventh practical example, process conditions other than the temperature of the wafer W is the same as the process conditions of the fourth practical example.

As illustrated in FIG. 19A, with respect to six locations of a trench, which has the aspect ratio of 10, the width of 0.23 micrometers and the depth of 2.3 micrometers, including an R including a surface, a TOP SIDE, MIDs 1, 2 and 3, and a BTM SIDE, when a film thickness of the top was made 100%, how many percentages of the film was deposited at the other locations was examined. Samples were a working example 16 in which a temperature of a wafer W was set at 250 degrees C. and a seed layer was formed, a working example 17 in which the temperature of the wafer W was set at 350 degrees C. and the seed layer was formed, and a comparative example 18 in which the temperature of the wafer W was set at 350 degrees C. and the seed layer was not formed.

As illustrated in FIG. 19B, when comparing the examples in which the temperature of the wafer W was set at 350 degrees C., coverage properties of a working example 17 with the seed layer were better than a comparative example 19 without the seed layer. When comparing a working example 16 with the working example 17 with a seed layer, the working example 16 of the low temperature process achieved better coverage properties than that of the working example 17. Hence, even in the film deposition of the SiN film, the result has indicated that the coverage properties can be improved in addition to the decrease of the incubation time by forming the seed layer. Furthermore, the result has also indicated that the coverage properties can be further improved by making the low temperature process of a temperature of 300 degrees C. or lower.

FIG. 20 is a graph showing a result of having examined the surface roughness of films deposited by a method of depositing a silicon-containing film of an eighth practical example of the present invention. Samples were a working example 18 of a silicon oxide film with a seed layer, a working example 19 of a silicon nitride film with the seed layer, a comparative example 19 of a silicon film without the seed layer and a comparative example 20 of a silicon nitride film without the seed layer. Here, even in the eighth practical example, process conditions other than the temperature of the wafer W was the same as the process conditions of the fourth practical example.

Comparing the working example 18 with the comparative example 19 between the silicon films, the surface roughness Ra of the working example 18 was smaller than that of the comparative example 19 at any temperature. Moreover, comparing the working example 19 with the comparative example 20 between the silicon nitride films, the surface roughness Ra of the working example 19 was smaller than that of the comparative example 20 at any temperature. Furthermore, when the temperature of the wafer W was set at 250 degrees C., a very small value of the surface roughness Ra of 0.16 was obtained.

The result has indicated that the method of depositing the silicon-containing film according to the embodiments forming the seed layer is highly effective in depositing a flat film having the small surface roughness.

According to the embodiments of the present invention, a high-quality silicon-containing film can be deposited by using a turntable-type film deposition apparatus.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of manufacturing the silicon oxide film has been described in detail, it should be understood that the various changes, substitutions, and alterations could be made hereto without departing from the spirit and scope of the invention.

What is claimed is:

1. A method of depositing a silicon-containing film using a film deposition apparatus, the apparatus including a turntable provided in a process chamber and configured to receive a substrate thereon, first and second process areas provided apart from each other along a rotational direction of the turntable, a first process gas supplying unit configured to supply a first process gas to the substrate in the first process area, and a second process gas supplying unit configured to supply a second process gas to the substrate in the second process area, the method comprising steps of:

forming a seed layer on a surface of the substrate by supplying an aminosilane gas from the first process gas supplying unit for a predetermined period of time while rotating the turntable;

supplying a boron-containing gas as a catalytic gas from the first gas supplying unit to the surface of the substrate while rotating the turntable after finishing the step of forming the seed layer on the surface of the substrate; and supplying a silane-based gas as a source gas from the second process gas supplying unit to the surface of the substrate while rotating the turntable and causing silicon atoms contained in the silane-based gas to bond with each other on the surface of the substrate by a catalytic action of the boron-containing gas.

2. The method as claimed in claim 1, wherein the steps of supplying the boron-containing gas as the catalytic gas and supplying the silane-based gas as the source gas are repeated until a silicon-containing film is deposited up to a predetermined film thickness on the surface of the substrate.

3. The method as claimed in claim 1, wherein the steps of forming the seed layer, supplying the boron-containing as and supplying the silane-based gas as the source gas are performed in a state of heating the substrate in a range of 200 to 350 degrees C.

4. The method as claimed in claim 3, wherein the steps of forming the seed layer, supplying the boron-containing gas as the catalytic gas and supplying the silane-based gas as the source gas are performed in a state of heating the substrate in a range of 250 to 350 degrees C.

5. The method as claimed in claim 2, further comprising: purging the substrate by supplying a separation gas to the substrate in a separation area.

6. The method as claimed in claim 1, wherein the step of forming the seed layer is performed for three to seven minutes.

7. The method as claimed in claim 1, wherein the aminosilane gas is (diisopropylamino)silane gas.

8. The method as claimed in claim 1, wherein the boron-containing gas includes $BH_3$, $B_2H_6$, $B(CH_3)$, $B(C_2H_5)_3$, or $BCl_3$.

9. The method as claimed in claim 1, wherein the silane-based gas includes $SiH_4$, $Si_2H_6$ or $Si_3H_8$.

10. The method as claimed in claim 1, wherein the film deposition apparatus includes separation areas located upstream of the first process area in the rotational direction of the turntable and between the first process area and the second process area and configured to supply a separation gas to separate the first process gas from the second process gas, and further comprising:
supplying the separation gas to the substrate before the step of supplying the boron-containing gas as the catalytic gas and between the steps of supplying the boron-containing gas as the catalytic gas and supplying the silane-based gas as the source gas while rotating the turntable.

11. The method as claimed in claim 1, wherein the film deposition apparatus further includes a third process area provided apart from the second process area located downstream of the second process area in the rotational direction of the turntable, a third process gas supplying unit configured to supply a third process gas to the surface of the substrate in the third process area, and a plasma generator configured to generate plasma from the third process gas supplied from the third process gas supplying unit, and further comprising a step of:

supplying a nitriding plasma to the surface of the substrate in the third process area while rotating the turntable after the step of supplying the aminosilane gas.

12. The method as claimed in claim 11,
wherein the third process gas is nitrogen gas or ammonia gas, and
the nitriding plasma is $N_2$ plasma or $NH_3$ plasma.

13. The method as claimed in claim 11,
wherein the film deposition apparatus includes a third separation area provided between the second process area and the third process area and configured to supply the separation gas to separate the second process gas from the third process gas, and
further comprising a step of:
supplying the separation gas to the substrate while rotating the turntable between the steps of supplying the boron-containing gas as the catalytic gas and supplying the silane-based gas as the source gas.

* * * * *